(12) United States Patent
Kao et al.

(10) Patent No.: US 12,374,638 B2
(45) Date of Patent: Jul. 29, 2025

(54) PASSIVATION STRUCTURE FOR METAL PATTERN

(71) Applicant: Taiwan Semiconductor Manufacturing Company, Ltd., Hsin-Chu (TW)

(72) Inventors: Ching-Hung Kao, Tainan (TW); Kuei-Yu Deng, Taichung (TW); Tzy-Kuang Lee, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/574,257

(22) Filed: Jan. 12, 2022

(65) Prior Publication Data

US 2023/0052604 A1 Feb. 16, 2023

Related U.S. Application Data

(60) Provisional application No. 63/230,207, filed on Aug. 6, 2021.

(51) Int. Cl.
*H01L 23/00* (2006.01)

(52) U.S. Cl.
CPC .............. *H01L 24/02* (2013.01); *H01L 24/03* (2013.01); *H01L 24/05* (2013.01); *H01L 2224/02181* (2013.01); *H01L 2224/02185* (2013.01); *H01L 2224/0219* (2013.01); *H01L 2224/0382* (2013.01); *H01L 2224/05541* (2013.01); *H01L 2224/05624* (2013.01); *H01L 2224/05647* (2013.01); *H01L 2924/35121* (2013.01)

(58) Field of Classification Search
CPC .............................. H01L 24/02; H01L 24/03; H01L 2224/02185
See application file for complete search history.

(56) References Cited

U.S. PATENT DOCUMENTS

| | | | |
|---|---|---|---|
| 9,299,612 B2 | 3/2016 | Wu et al. | |
| 9,941,196 B2* | 4/2018 | Lee | H01L 23/49838 |
| 10,756,038 B1* | 8/2020 | Chiu | H01L 21/6836 |
| 2004/0169282 A1* | 9/2004 | Koh | H01L 21/7682 |
| | | | 257/758 |

FOREIGN PATENT DOCUMENTS

| | | |
|---|---|---|
| CN | 113611618 A | 11/2021 |
| TW | 202120598 A | 6/2021 |

\* cited by examiner

*Primary Examiner* — Dale E Page
*Assistant Examiner* — Ilner Jean Baptiste
(74) *Attorney, Agent, or Firm* — HAYNES AND BOONE, LLP

(57) ABSTRACT

A semiconductor device and method of manufacturing the same are provided. The semiconductor device may include a substrate, a first via, a first pad, a second pad, and a first passivation layer. The first pad may be over the substrate. The second pad may be over the substrate. The second pad may be parallel to the first pad. The first passivation layer may surround the first pad and the second pad. The first passivation layer may include a first part on the first pad. The first passivation layer may include a second part on the second pad. A thickness of the first part of the first passivation layer may exceed a height of the first pad. A thickness of the second part of the first passivation layer may exceed a height of the second pad.

20 Claims, 14 Drawing Sheets

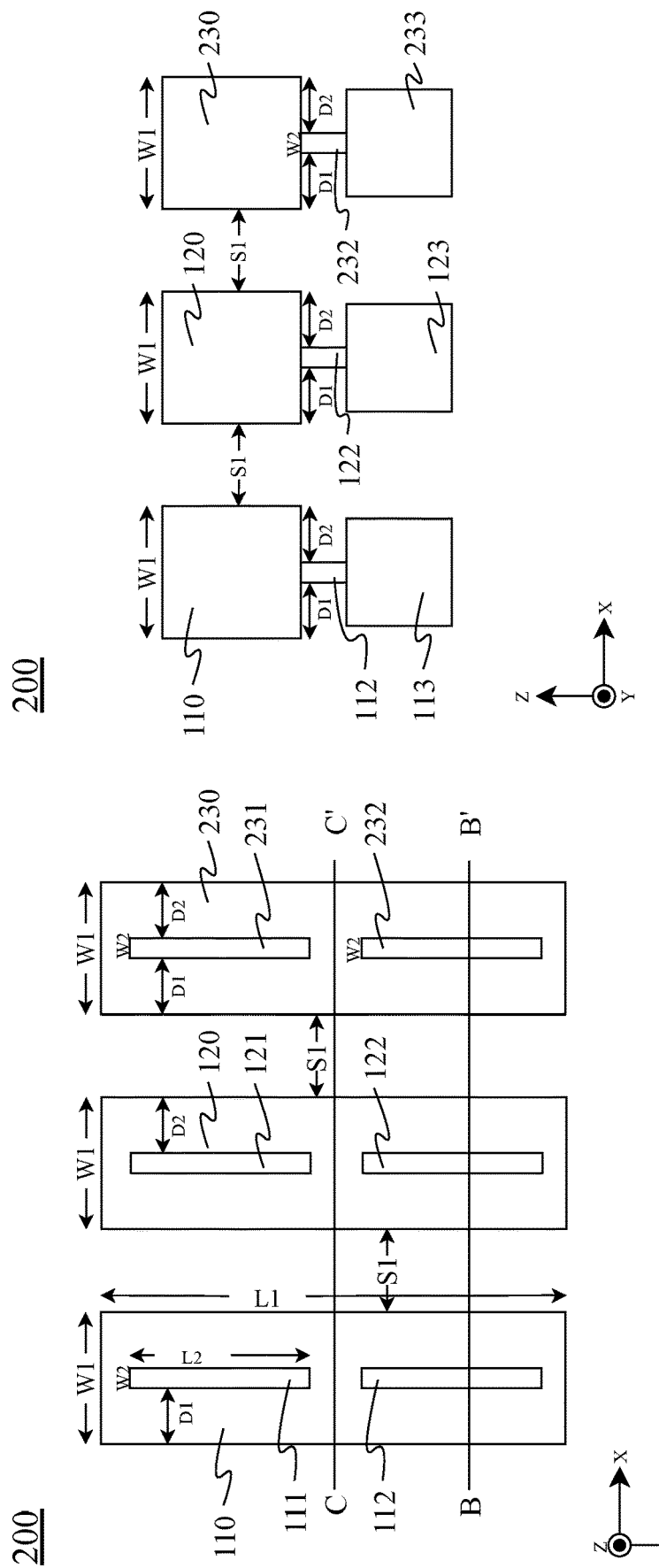

PASSIVATION STRUCTURE FOR METAL PATTERN

This application is a non-provisional application of claims priority to U.S. Provisional Patent Application Ser. No. 63/230,207, filed Aug. 6, 2021, the disclosure of which is hereby incorporated by reference in its entirety.

BACKGROUND

The semiconductor integrated circuit (IC) industry has experienced rapid growth, with each generation utilizing smaller and more complex circuits. However, such advances increase the complexity of processing and manufacturing and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

With such decreasing geometry size in ICs, physical stress due to temperature changes may be critical.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 2A is a diagram of a layout of a semiconductor device, in accordance with some embodiments of the present disclosure.

FIG. 2B is a cross-section of the semiconductor device of FIG. 2A along line BB', in accordance with some embodiments of the present disclosure.

DETAILED DESCRIPTION

Figure 1B:
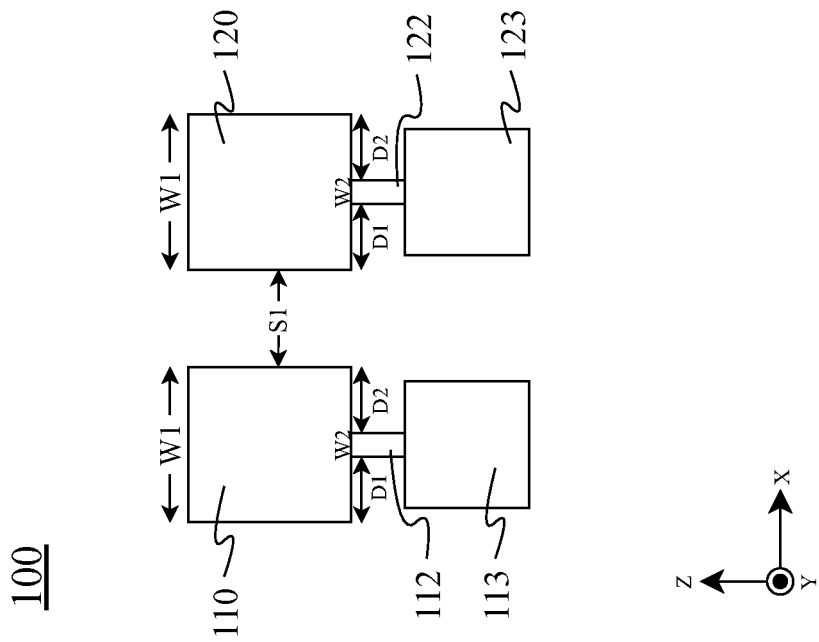
FIG. 1B is a cross-section of the semiconductor device of FIG. 1A along line AA', in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Metal pads, such as soldering pads or wire bonding pads, have been used for various IC applications. In order to function properly, a metal pad should have sufficient size and strength to withstand physical stress from such actions as soldering or wire bonding. However, the ever-decreasing geometry size of ICs has further dictated a reduction in the size of metal pads, and often conventional metal pads and passivation layers may suffer from problems such as peeling or cracking in layers surrounding the metal pads.

The present disclosure provides a novel semiconductor including a via and a passivation of improved design to provide support for a metal pad.

Figure 1A:
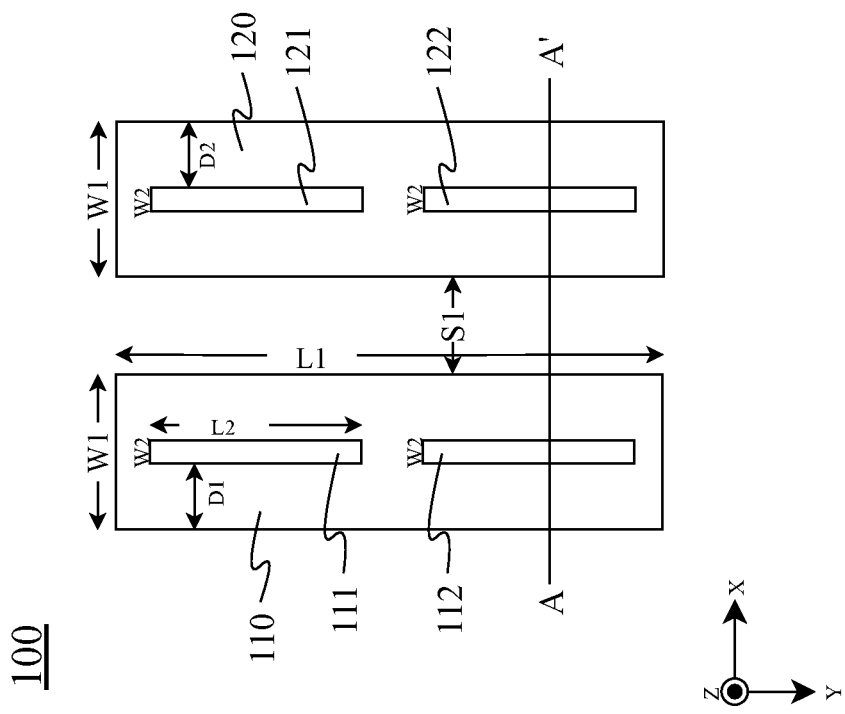
FIG. 1A is a diagram of a layout of a semiconductor device, in accordance with some embodiments of the present disclosure.

FIG. 1A is a diagram of a layout of a semiconductor device 100, in accordance with some embodiments of the present disclosure. In FIG. 1A, the x-axis may be horizontal, the y-axis may be vertical, and the z-axis may be orthogonal to the plane of the figure.

The semiconductor device 100 includes pads 110 and 120 and vias 111, 112, 121, and 122. The pads 110 and 120 may comprise aluminum, copper, an aluminum copper alloy, the like, or a combination thereof. The vias 111, 112, 121, and 122 may comprise aluminum, copper, an aluminum copper alloy, the like, or a combination thereof. In some embodiments, the pad 110 and vias 111 and 112 may be formed in a single process (e.g., a deposition process). The pad 120 and vias 121 and 122 may be formed in a single process (e.g., a deposition process).

In FIG. 1A, the pad 110 may connect with the vias 111 and 112. The pad 120 may connect with the vias 121 and 122. The vias 111 and 112 may be formed at a level lower than that of pad 110. The vias 121 and 122 may be formed at a level lower than that of pad 120.

The semiconductor device 100 of the present disclosure may be manufactured under processes of different nanometer scale. For example, the semiconductor device 100 may be manufactured under a 28 nm process. In some embodiments, the width W1 of the pad 110 may be from 3.5 μm to 6 μm. The width W1 of the pad 120 may be from 3.5 μm to 6 μm. The pads 110 and 120 may be spaced apart by the spacing S1. In some embodiments (e.g., semiconductor devices manufactured under a 28 nm process), the spacing S1 may not exceed 5 μm.

In some embodiments (e.g., semiconductor devices manufactured under a 28 nm process), the width W2 of the via 111 may be from 1 μm to 1.7 μm. In an embodiment, the width W2 may be 1.7 μm. The width W2 of the via 112 may be from 1 μm to 1.7 μm. In an embodiment, the width W2 may be 1.7 μm. The width W2 of the via 121 may be from 1 μm to 1.7 μm. In an embodiment, the width W2 may be 1.7 μm. The width W2 of the via 122 may be from 1 μm to 1.7 μm. In an embodiment, the width W2 may be 1.7 μm.

In some embodiments, the semiconductor device 100 may be manufactured under processes of different nanometer scale. In some embodiments, the ratio of W2 to W1 may be from 0.16 to 0.48. When the ratio of the width of the vias to the width of the pads (e.g., W2/W1) is from 0.16 to 0.48, passivation cracking between the two pads (e.g., pads 110 and 120) may be effectively avoided. The reasons why passivation cracking between the two pads is effectively avoided include that the stress (e.g., due to changes of temperature) can be distributed or released by the thick, wide, and/or continuous passivation layer on the pads.

In some embodiments (e.g., semiconductor devices manufactured under a 28 nm process), the length L1 of the pad 110 may be from 10 μm to 2000 μm. The length L1 of the pad 120 may be from 10 μm to 2000 μm. When lengths of pads 110 and 120 are substantially identical and pads 110 and 120 parallel, the parallel run length (PRL) of pads 110 and 120 may be from 10 μm to 2000 μm.

In some embodiments (e.g., semiconductor devices manufactured under a 28 nm process), the length L2 of the via 111 may be from 5 μm to 30 μm. In an embodiment, the length L2 may be 7.2 μm. The length L2 of the via 112 may be from 5 μm to 30 μm. In an embodiment, the length L2 may be 7.2 μm. The length L2 of the via 121 may be from 5 μm to 30 μm. In an embodiment, the length L2 may be 7.2 μm. The length L2 of the via 122 may be from 5 μm to 30 μm. In an embodiment, the length L2 may be 7.2 μm.

In some embodiments, the ratio of W2 to L2 does not exceed 0.34. When the ratio of the width of the vias to the length of the vias (e.g., W2/L2) does not exceed 0.34, passivation cracking between the two pads (e.g., pads 110 and 120) may be effectively avoided. The reasons why passivation cracking between the two pads is effectively avoided include that the stress (e.g., due to changes of temperature) can be distributed or released by the thick, wide, and/or continuous passivation layer on the pads.

In FIG. 1A, the distance D1 may be measured from the left side of the via 111 (or via 112) to the left side of the pad 110 along the width (e.g., the width W1 or W2). The distance D1 along the width may be measured from the boundary of the via 111 (or via 112) to the boundary of the pad 110 on the same side (e.g., the left side). When the via 111 (or via 112) is located at the center of the pad 110 along the width, the distance between the right side of the via 111 (or via 112) and the right side of the pad 110 may be substantially identical to the distance D1. In some embodiments (e.g., semiconductor devices manufactured under a 28 nm process), the distance D1 may be from 0.9 μm (e.g., W1=3.5 μm, W2=1.7 μm) to 2.5 μm (e.g., W1=6 μm, W2=1 μm). In some embodiments, the ratio of D1 to W2 may be from 0.52 (e.g., D1=0.9 μm, W2=1.7 μm) to 2.5 (e.g., D1=2.5 μm, W2=1 μm). In some embodiments, the ratio of D1 to W1 may be from 0.25 (e.g., D1=0.9 μm, W1=3.5 μm) to 0.42 (e.g., D1=2.5 μm, W1=6 μm).

The distance D2 may be measured from the right side of the via 121 (or via 122) to the right side of the pad 120 along the width (e.g., the width W1 or W2). The distance D2 along the width may be measured from the boundary of the via 121 (or via 122) to the boundary of the pad 120 on the same side (e.g., the right side). When the via 121 (or via 122) is located at the center of the pad 120 along the width, the distance between the left side of the via 121 (or via 122) and the left side of the pad 120 may be substantially identical to the distance D2. In some embodiments (e.g., semiconductor devices manufactured under a 28 nm process), the distance D2 may be from 0.9 μm (e.g., W1=3.5 μm, W2=1.7 μm) to 2.5 μm (e.g., W1=6 μm, W2=1 μm). In some embodiments, the ratio of D2 to W2 may be from 0.52 (e.g., D2=0.9 μm, W2=1.7 μm) to 2.5 (e.g., D2=2.5 μm, W2=1 μm). In some embodiments, the ratio of D2 to W1 may be from 0.25 (e.g., D2=0.9 μm, W1=3.5 μm) to 0.42 (e.g., D2=2.5 μm, W2=6 μm).

In some embodiments, when D1/W2 and/or D2/W2 is from 0.52 to 2.5, passivation cracking between the pads 110 and 120 may be effectively avoided. In some embodiments, the D1/W1 and/or D2/W1 is from 0.25 to 0.42, passivation cracking between the pads 110 and 120 may be effectively avoided. The reasons why passivation cracking between the two pads is effectively avoided include that the stress (e.g., due to changes of temperature) can be distributed or released by the thick, wide, and/or continuous passivation layer on the pads.

FIG. 1B is a cross-section of the semiconductor device 100 of FIG. 1A along line AA', in accordance with some embodiments of the present disclosure. In FIG. 1B, the x-axis may be horizontal, the z-axis may be vertical, and the y-axis may be orthogonal to the plane of the figure.

In FIG. 1B, the via 112 may be formed at a level lower than that of pad 110. The via 122 may be formed at a level lower than that of pad 120. In some embodiments, the pad 110 and via 112 may be formed in a single process (e.g., a deposition process). The pad 120 and via 122 may be formed in a single process (e.g., a deposition process).

FIG. 1B further shows the metal contacts 113 and 123. The metal contact 113 may be formed at a level lower than those of the via 112 and the pad 110. The metal contact 123 may be formed at a level lower than those of the via 122 and the pad 120. The pad 110 may be connected to the metal contact 113 through the via 112. The pad 110 may be connected to the metal contact 113 through the vias 111 and 112. The pad 120 may be connected to the metal contact 123 through the via 122. The pad 120 may be connected to the metal contact 123 through the vias 121 and 122. The metal contacts 113 and 123 may comprise copper, aluminum, aluminum copper, tungsten, nickel, the like, or a combination thereof. The metal contacts 113 and 123 may be ultra-thick metal (UTM) contacts. For example, UTM contacts may be formed at a thickness of about 3 times the thickness a typical top metal or about 10 times the thickness of the other metal layers Mn through M1. The metal contacts 113 and 123 may be a part of a top metal layer in a semiconductor device.

In some embodiments, a passivation layer (e.g., passivation layer 518) may be disposed between the pads 110 and 120 and the metal contacts 113 and 123; the passivation layer (e.g., passivation layer 518) may surround the vias 111, 112, 121, and 122. In some embodiments, a passivation layer (e.g., passivation layer 520) may cover and surround the pads 110 and 120.

In FIG. 1B, the pads 110 and 120 may be spaced apart by the spacing S1. In some embodiments (e.g., semiconductor devices manufactured under a 28 nm process), the spacing S1 may not exceed 5 μm.

In FIG. 1B, the distance D1 may be measured from the left side of the via 112 to the left side of the pad 110 along the width (e.g., the direction of the width W1 or W2). The distance D2 may be measured from the right side of the via 112 to the right side of the pad 110 along the width. The distance D1 may be measured from the boundary of the via 112 to the boundary of the pad 110 on the left side. The distance D2 may be measured from the boundary of the via 112 to the boundary of the pad 110 on the right side.

In FIG. 1B, the distance D2 may be measured from the right side of the via 122 to the right side of the pad 120 along the width (e.g., the direction of the width W1 or W2). The distance D1 may be measured from the left side of the via 122 to the left side of the pad 120 along the width (e.g., W1 or W2). The distance D2 may be measured from the boundary of the via 122 to the boundary of the pad 120 on the right side. The distance D1 may be measured from the boundary of the via 122 to the boundary of the pad 120 on the left side.

In some embodiments (e.g., semiconductor devices manufactured under a 28 nm process), the distance D1 may be from 0.9 μm (e.g., W1=3.5 μm, W1=1.7 μm) to 2.5 μm (e.g., W1=6 μm, W2=1 μm). In some embodiments, the ratio of D1 to W2 may be from 0.52 (e.g., D1=0.9 μm, W2=1.7 μm) to 2.5 (e.g., D1=2.5 μm, W2=1 μm). In some embodiments, the ratio of D2 to W1 may be from 0.25 (e.g., D2=0.9 μm, W1=3.5 μm) to 0.42 (e.g., D2=2.5 μm, W1=6 μm). In some embodiments (e.g., semiconductor devices manufactured under a 28 nm process), the distance D2 may be from 0.9 μm (e.g., W1=3.5 μm, W2=1.7 μm) to 2.5 μm (e.g., W1=6 μm, W2=1 μm). In some embodiments, the ratio of D2 to W2 may be from 0.52 (e.g., D2=0.9 μm, W2=1.7 μm) to 2.5 (e.g., D2=2.5 μm, W2=1 μm). In some embodiments, the ratio of D2 to W1 may be from 0.25 (e.g., D2=0.9 μm, W1=3.5 μm) to 0.42 (e.g., D2=2.5 μm, W1=6 μm). When the via 112 is located at the center of the pad 110 along the width, D1 and D2 may be substantially identical. When the via 122 is located at the center of the pad 120 along the width, D1 and D2 may be substantially identical.

In some embodiments, the pad 110, the via 112, and the metal contact 113 may be substantially identical to the pad 120, the via 122, and the metal contact 123, respectively.

FIG. 2A is a diagram of a layout of a semiconductor device 200, in accordance with some embodiments of the present disclosure. In FIG. 2A, the x-axis may be horizontal, the y-axis may be vertical, and the z-axis may be orthogonal to the plane of the figure.

The semiconductor device 200 includes pads 110, 120, and 230 and vias 111, 112, 121, 122, 231, and 232. Compared with the semiconductor device 100 of FIG. 1A, the semiconductor device 200 further includes the pad 230 and the vias 231 and 232. With the pad 230, the passivation layer on the pad 120 (i.e., the center pad) may suffer more stress and may be cracked with a high probability. The pad 230 may comprise aluminum, copper, an aluminum copper alloy, the like, or a combination thereof. The vias 231 and 232 may comprise aluminum, copper, an aluminum copper alloy, the like, or a combination thereof. In some embodiments, the pad 230 and vias 231 and 232 may be formed in a single process (e.g., a deposition process). The pad 230 may connect with the vias 231 and 232. The vias 231 and 232 may be formed at a level lower than that of pad 230.

The semiconductor device 200 may be manufactured under processes of different nanometer scale. Similar to the semiconductor device 100, the semiconductor device 200 may be manufactured under a 28 nm process. In some embodiments, the width W1 of the pad 230 may be from 3.5 μm to 6 μm. The widths of pads 110, 120, and 230 may be substantially identical. Similar to the semiconductor device 100, the width W2 of the via 231 may be from 1 μm to 1.7 μm; the width W2 of the via 232 may be from 1 μm to 1.7 μm. In an embodiment, the width W2 of the vias 231 and 232 may be 1.7 μm. The widths of the via 231 and 232 may be substantially identical. The widths of the vias 111, 112, 121, 122, 231, and 232 may be substantially identical. In some embodiments, when the ratio of the width W2 of the vias (e.g., 111, 112, 121, 122, 231, and 232) to the width W1 of the pads (e.g., 110, 120, and 230) is from 0.16 to 0.48, passivation cracking between two pads may be effectively avoided. The reasons why passivation cracking between the pads is effectively avoided include that the stress (e.g., due to changes of temperature) can be distributed or released by the thick, wide, and/or continuous passivation layer on the pads.

Similar to the semiconductor device 100, the length of the pad 230 may be from 10 μm to 2000 μm. The lengths of the pads 110, 120, and 230 may be substantially identical. When lengths of the pads 110, 120, and 230 are substantially identical and pads 110, 120, and 230 parallel, the parallel run length (PRL) of the pads 110, 120, and 230 may be from 10 μm to 2000 μm.

Similar to the semiconductor device 100, the length of the via 231 may be from 5 μm to 30 μm and the length of the via 232 may be from 5 μm to 30 μm. In an embodiment, the lengths of the vias 231 and 232 may be 7.2 μm. The lengths of the vias 231 and 232 may be substantially identical. The lengths of the vias of 111, 112, 121, 122, 231, and 232 may be substantially identical. In some embodiments, when the ratio of the width of the vias (e.g., 111, 112, 121, 122, 231) to the length of the vias (e.g., 111, 112, 121, 122, 231) does not exceed 0.34, passivation cracking between the two pads may be effectively avoided. The reasons why passivation cracking between the pads is effectively avoided include that the stress (e.g., due to changes of temperature) can be distributed or released by the thick, wide, and/or continuous passivation layer on the pads.

In FIG. 2A, the pads 110 and 120 may be spaced apart by the spacing S1. In some embodiments (e.g., semiconductor devices manufactured under a 28 nm process), the spacing S1 may not exceed 5 μm. The pads 120 and 230 may be spaced apart by the spacing S2. In some embodiments (e.g., semiconductor devices manufactured under a 28 nm process), the spacing S2 may not exceed 5 μm.

The pads 110 and 120 may be spaced apart by the spacing S1. In some embodiments (e.g., semiconductor devices manufactured under a 28 nm process), the spacing S1 may not exceed 5 μm. The pads 120 and 230 may be spaced apart by the spacing S1. In some embodiments (e.g., semiconductor devices manufactured under a 28 nm process), the spacing S1 may not exceed 5 μm.

FIG. 2B is a cross-section of the semiconductor device 200 of FIG. 2A along line BB', in accordance with some embodiments of the present disclosure. In FIG. 2B, the x-axis may be horizontal, the z-axis may be vertical, and the y-axis may be orthogonal to the plane of the figure.

Similar to the semiconductor device 100, the metal contact 233 may be formed at a level lower than those of the via 232 and the pad 230. The pad 230 may be connected to the metal contact 233 through the via 232. The metal contact 233 may comprise copper, aluminum, aluminum copper, tungsten, nickel, the like, or a combination thereof. The metal contacts 113, 123, and 233 may be ultra-thick metal contacts. The metal contacts 113, 123, and 233 may be a part of a top metal layer in a semiconductor device.

In FIG. 2B, the pads 110 and 120 may be spaced apart by the spacing S1. In some embodiments (e.g., semiconductor devices manufactured under a 28 nm process), the spacing S1 may not exceed 5 μm. The pads 120 and 230 may be spaced apart by the spacing S2. In some embodiments (e.g., semiconductor devices manufactured under a 28 nm process), the spacing S2 may not exceed 5 μm.

Similar to the semiconductor device 100, the distance D1 may be measured from the left side of the via 232 to the left side of the pad 230 along the width (W1 or W2); the distance D2 may be measured from the right side of the via 232 to the right side of the pad 230 along the width (W1 or W2). In some embodiments (e.g., semiconductor devices manufactured under a 28 nm process), these two distances may be from 0.9 μm (e.g., width W1 of the pad 230=3.5 μm, width W2 of the via 232=1.7 μm) to 2.5 μm (e.g., width W1 of the pad 230, 6 μm, width W2 of the via 232, 1 μm). In some embodiments, the ratio of one of these two distances (D1 or D2) to the width W2 of the via 232 may be from 0.52 (e.g., distance D1 or D2=0.9 μm, width W2 of the via 232=1.7 μm) to 2.5 (e.g., distance D1 or D2=2.5 μm, width W2 of the via 232, 1 μm), and passivation cracking between any two of the pads 110, 120, and 230 may be effectively avoided. The reasons why passivation cracking between the pads is effectively avoided include that the stress (e.g., due to changes of temperature) can be distributed or released by the thick, wide, and/or continuous passivation layer on the pads.

In some embodiments, the ratio of one of these two distances (D1 or D2) to the width W1 of the pad 230 may be from 0.25 (e.g., distance D1 or D2=0.9 μm, width W1 of the pad 230=3.5 μm) to 0.42 (e.g., distance D1 or D2=2.5 μm, width W1 of the pad 230, 6 μm), and passivation cracking between any two of the pads 110, 120, and 230 may be effectively avoided. The reasons why passivation cracking between the pads is effectively avoided include that the stress (e.g., due to changes of temperature) can be distributed or released by the thick, wide, and/or continuous passivation layer on the pads. When the via 232 is located at the center of the pad 230 along the width, these two distances may be substantially identical.

Figure 3:
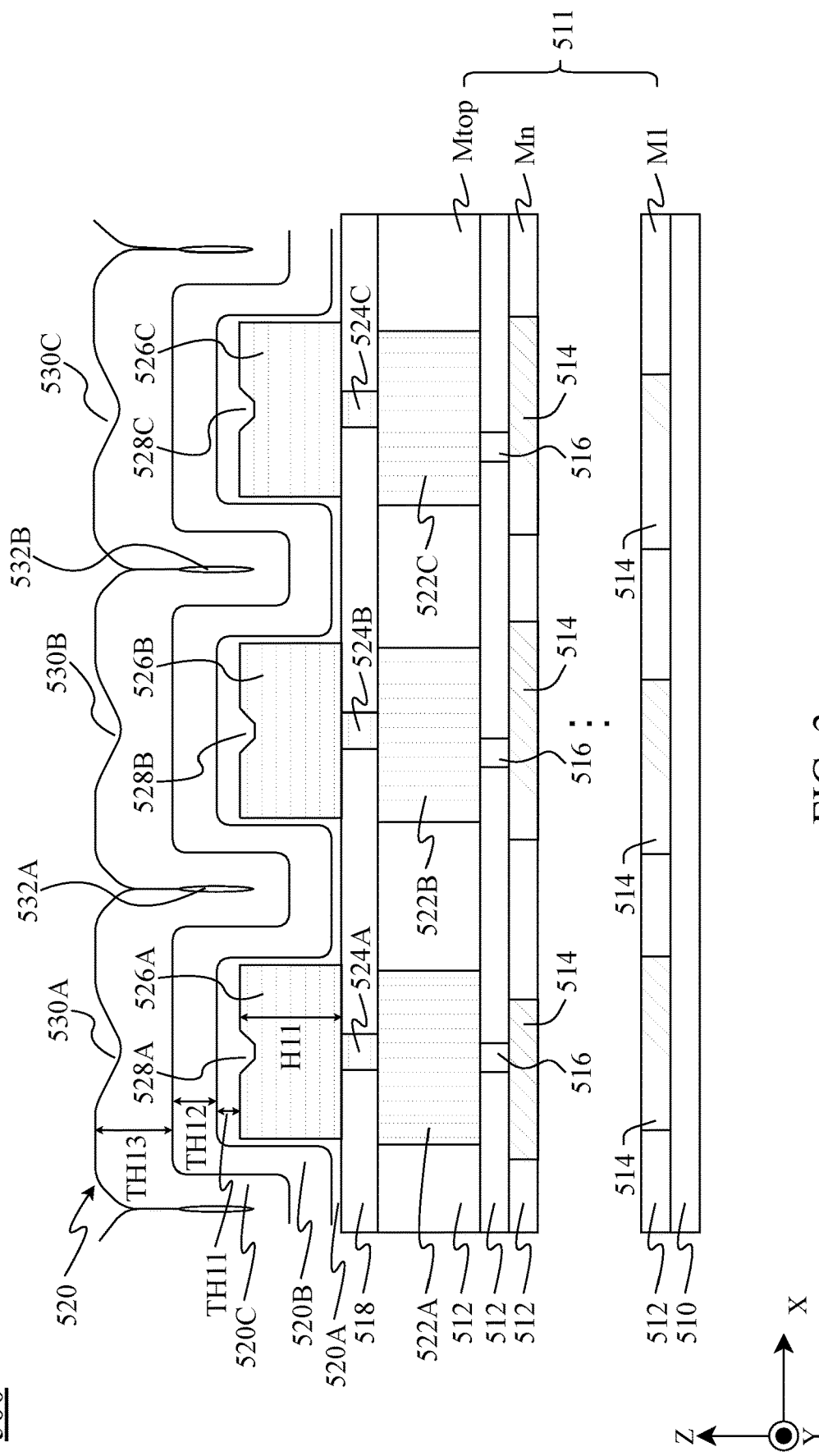
FIG. 3 is a cross-section of a semiconductor device, in accordance with some embodiments of the present disclosure.

FIG. 3 is a cross-section of a semiconductor device 500, in accordance with some embodiments of the present disclosure. The cross-section of the semiconductor device 500 shown in FIG. 3 may be observed along a line similar to the line BB' of semiconductor device 200 of FIG. 2A.

A portion of semiconductor device 500 includes a substrate 510 with an interconnect structure 511, metal contacts 522A, 522B, and 522C, a passivation layer 518, vias 524A, 524B, and 524C, and pads 526A, 526B, and 526C, and a passivation layer 520. In this embodiment, the substrate 510 may be silicon. In other embodiments, the substrate 510 may include silicon germanium (SiGe), silicon oxide, nitride, the like, or a combination thereof. The substrate 510 may include integrated circuits comprising active devices and passive devices.

The interconnect structure 511 comprises metal lines 514 and vias 516 to electrically connect the various active devices and/or passive devices to form functional circuitry or an integrated circuit. Conductive materials, such as copper, aluminum, or the like, with or without a barrier layer, can be used as the metal lines 514 and the vias 516. The metal lines 514 and the vias 516 may be formed using a single and/or dual damascene process, via-first process, or metal-first process. Interconnect structure 511 may include a plurality of metal layers, namely M1, Mn, . . . , and Mtop. The metal layer M1 may be the metal layer immediately above the substrate 510. The metal layer Mn may be an intermediate layer above metal layer M1. The metal layer Mtop may be the top metal layer immediately under the vias 524A, 524B, and 524C and pads 526A, 526B, and 526C. Throughout the description, the term "metal layer" may refer to the collection of the metal lines in the same layer. Metal layers M1 through Mn through Mtop may be formed in inter-metal dielectrics (IMDs) (or passivation layers) 512, which may be formed of oxides such as silicon oxide, borophosphosilicate glass (BPSG), undoped silicate glass (USG), fluorinated silicate glass (FSG), low-k dielectric materials, the like, or a combination thereof. The low-k dielectric materials may have k values lower than 3.9.

The metal layer Mtop may comprise one or more contacts, such as metal contacts 522A, 522B, and 522C. The metal contacts 522A, 522B, and 522C may be formed over and in electrical contact with the metal layers Mn of the interconnect structure 511. The metal contacts 522A, 522B, and 522C may comprise copper, aluminum, aluminum copper, tungsten, nickel, the like, or a combination thereof. In some embodiments, the metal lines 514 and metal contacts 522A, 522B, and 522C may be formed at a thickness from about 0.3 µm to about 1.2 µm. In other embodiments, the metal layer Mtop and metal contacts 522A, 522B, and 522C may be a top metal or an ultra-thick metal (UTM). An UTM may be formed at a thickness of about 3 times the thickness a typical top metal or about 10 times the thickness of the other metal layers Mn through M1. It is understood, however, that the dimensions recited throughout the description are merely examples, and may be changed in alternative embodiments.

The passivation layer 518 may be formed over the interconnect structure 511 and the metal contacts 522A, 522B, and 522C. In an embodiment, the passivation layer 518 may be formed at a thickness between about 0.7 µm and about 1 µm. After the passivation layer 518 has been formed, one or more openings (e.g., the openings for the vias 524A, 524B, and 524C) may be formed through the passivation layer 518 by removing portions of the passivation layer 518 to expose at least a portion of the underlying metal contacts 522A, 522B, and 522C. The via 524A may allow contact between the metal contact 522A and the pad 526A. The via 524B may allow contact between the metal contact 522B and the pad 526B. The via 524C may allow contact between the metal contact 522C and the pad 526C. The passivation layer 518 may surround the vias 524A, 524B, and 524C. The vias 524A, 524B, and 524C may be formed using a suitable photolithographic mask and etching process, although any suitable process to expose portions of the metal contacts 522A, 522B, and 522C may be used.

After the vias 524A, 524B, and 524C have been formed, the pads 526A, 526B, and 526C may be formed to extend along the passivation layer 518 and may be in electrical connection with the metal contacts 522A, 522B, and 522C. The pads 526A, 526B, and 526C may be utilized to provide electrical connection between the metal contacts 522A, 522B, and 522C and the metal features in layers above the pads 526A, 526B, and 526C. In an embodiment, the pads 526A, 526B, and 526C may comprise aluminum, copper, an aluminum copper alloy, the like, or a combination thereof and may be formed to have a substantial height H11 (or a substantial thickness) between about 1.4 µm and about 2.8 µm. In one embodiment, the substantial height H11 of the pads 526A, 526B, and 526C may be 2.5 µm. In some embodiments, the via 524A and the pad 526A may be formed in a single process (e.g., a deposition process). The via 524B and the pad 526B may be formed in a single process (e.g., a deposition process). The via 524C and the pad 526C may be formed in a single process (e.g., a deposition process). In some embodiments, one or more barrier layers (not shown) may be formed at the bottom of the vias 524A, 524B, and 524C comprising titanium, titanium nitride, tantalum, tantalum nitride, the like, or a combination thereof.

The pads 526A and 526B may be spaced apart by a spacing. The pads 526B and 526C may be spaced apart by a spacing. The spacings between pads 526A and 526B and between 526B and 526C may be substantially identical. In some embodiments (e.g., semiconductor devices manufactured under a 28 nm process), the spacings between pads 526A and 526B and between pads 526B and 526C may not exceed 5 µm.

After the formation of the pads 526A, 526B, and 526C, the passivation layer 520 may be formed. In an embodiment, the passivation layer 520 may be conformal with substantially the same thickness across the semiconductor device 500. The passivation layer 520 may comprise high density plasma (HDP) oxide (e.g., a layer of oxide formed by a HDP chemical vapor deposition), undoped silicate glass (USG), fluorinated silicate glass (FSG), silicon oxide (e.g., SiOx), silicon nitride (e.g., SiN), the like, or a combination thereof. In an embodiment, the passivation layer 520 may be formed to have a thickness between about 2.9 µm and about 3.5 µm. The passivation layer 520 may surround and/or cover the pads 526A, 526B, and 526C.

In some embodiments, because pad 526A and via 524A may be formed in a single process, a recess 528A may be formed on the top of the pad 526A. Because pad 526B and via 524B may be formed in a single process, a recess 528B may be formed on the top of the pad 526B. Because pad 526C and via 524C may be formed in a single process, a recess 528C may be formed on the top of the pad 526C.

In FIG. 3, the x-axis may be horizontal, the z-axis may be vertical, and the y-axis may be orthogonal to the plane of the figure. The widths or the radii of the recesses 528A, 528B, and 528C (along the x-axis) may be associated with the widths or the radii (along the x-axis) of the vias 524A, 524B, and 524C, respectively. When the widths or the radii of the vias 524A, 524B, and 524C (along the x-axis) increase, the widths or the radii of the recesses 528A, 528B, and 528C (along the x-axis) may increase correspondingly. When the widths or the radii of the vias 524A, 524B, and 524C (along the x-axis) decrease, the widths or radii of the recesses 528A, 528B, and 528C (along the x-axis) may decrease correspondingly.

The depths (along the z-axis) of the recesses 528A, 528B, and 528C may be associated with the widths or the radii of the vias 524A, 524B, and 524C (along the x-axis), respectively. When the widths or the radii of the vias 524A, 524B, and 524C increase (along the x-axis), the depths of the recesses 528A, 528B, and 528C (along the z-axis) may increase correspondingly.

The depths (along the z-axis) of the recesses 528A, 528B, and 528C may be associated with the lengths of the vias 524A, 524B, and 524C (along the y-axis), respectively. When the lengths of the vias 524A, 524B, and 524C increase (along the y-axis), the depths of the recesses 528A, 528B, and 528C (along the y-axis) may increase correspondingly.

The passivation layer 520 may be conformal with the pads 526A, 526B, and 526C and the passivation layer 518. Recesses 530A, 530B, and 530C on the passivation layer 520 may be formed corresponding to the recesses 528A, 528B, and 528C, respectively.

The widths or radii of the recesses 530A, 530B, and 530C (along the x-axis) may be associated with the widths or radii of the recesses 528A, 528B, and 528C (along the x-axis), respectively. The widths or the radii of the recesses 530A, 530B, and 530C (along the x-axis) may be associated with the widths or the radii (along the x-axis) of the vias 524A, 524B, and 524C, respectively. When the widths or the radii of the vias 524A, 524B, and 524C (along the x-axis) increase, the widths or the radii of the recesses 530A, 530B, and 530C (along the x-axis) may increase correspondingly. When the widths or the radii of the vias 524A, 524B, and 524C (along the x-axis) decrease, the widths or the radii of the recesses 530A, 530B, and 530C (along the x-axis) may decrease correspondingly.

Voids (or seams, cavities) 532A and 532B may be formed within the passivation layer 520. Because the passivation layer 520 may be grown from a partial surface of the passivation layer 518, the sidewalls of the pads 526A to 526C, and the top surfaces of the pads 526A to 526C, the voids 532A and 532B may thus be formed with the passivation layer 520. The passivation layer 520 may be substantially continuous since no obvious trenches are formed between the pads 526A, 526B and 526C.

The void 532A may be formed between the pads 526A and 526B. The void 532A may be separated from the pads 526A and 526B by the same distances. The void 532A may be formed at the central point of the line connected the pads 526A and 526B. The void 532B may be formed between the pads 526B and 526C. The void 532B may be separated from the pads 526B and 526C by the same distances. The void 532B may be formed at the central point of the line connected the pads 526A and 526B.

Each of voids 532A and 532B may be shaped as fusiform when observed in the cross-section shown in FIG. 3. The voids 532A and 532B may be formed to have a width (e.g., along the x-direction) between about 0.13 μm and about 0.15 μm. The voids 532A and 532B may be formed to have a length (e.g., along the z-direction) between about 1.9 μm and about 2.07 μm.

The passivation layer 520 may include a layer of dielectric material 520A, a layer of dielectric material 520B, and a layer of dielectric material 520C. The dielectric material 520A may include undoped silicate glass (USG). The dielectric material 520B may include high density plasma (HDP) oxide (e.g., a layer of oxide formed by a HDP chemical vapor deposition). The dielectric material 520C may include silicon nitride (e.g., SiN).

The layer of dielectric material 520A may be formed to have a thickness TH11 about 0.2 μm. A part of the layer of dielectric material 520A on the pad 526A, 526B, or 526C may be formed to have a thickness TH11 about 0.2 μm. The layer of dielectric material 520B may be formed to have a thickness TH12 about 1.3 μm. A part of the layer of dielectric material 520B on the pad 526A, 526B, or 526C may be formed to have a thickness TH12 about 1.3 μm. The layer of dielectric material 520C may be formed to have a thickness TH13 between about 1.4 μm and about 2 μm. A part of the layer of dielectric material 520C on the pad 526A, 526B, or 526C may be formed to have a thickness TH13 between about 1.4 μm and about 2 μm. In some embodiments, the thickness TH13 may exceed 2 μm. The passivation layer 520 may be formed to have a thickness between about 2.9 μm and about 3.5 μm. A part of the passivation layer 520 on the pad 526A, 526B, or 526C may be formed to have a thickness between about 2.9 μm and about 3.5 μm. In some embodiments, the thickness of the passivation layer 520 may exceed 3.5 μm. The voids 532A and 532B may be formed within the passivation layer 520. The voids 532A and 532B may be formed within the layer of dielectric material 520C.

When the passivation layer 520 is formed to have a thickness between about 2.9 μm and about 3.5 μm or a thickness exceeding 3.5 μm, passivation cracking (e.g., between pads 526A and 526B or between pads 526B and 526C) may be effectively avoided because the stress (e.g., due to changes of temperature) can be distributed or released by the thick, wide, and/or continuous passivation layer 520. When the layer of dielectric material 520C is formed to have a thickness TH13 between about 1.4 μm and about 2 μm or a thickness TH13 exceeding 2 μm, passivation cracking (e.g., between pads 526A and 526B or between pads 526B and 526C) may be effectively avoided because the stress (e.g., due to changes of temperature) can be distributed or released by the thick, wide, and/or continuous passivation layer 520. When a ratio of the thickness TH13 to the thickness TH11 exceeds 7, passivation cracking (e.g., between pads 526A and 526B or between pads 526B and 526C) may be effectively avoided because the stress (e.g., due to changes of temperature) can be distributed or released by the thick, wide, and/or continuous passivation layer 520.

When the passivation layer 520 is sufficiently thick to have voids (e.g., 532A and 532B) between pads (e.g., 526A to 526C), passivation cracking (e.g., between pads 526A and 526B or between pads 526B and 526C) may be effectively avoided because the stress (e.g., due to changes of temperature) can be distributed or released by the thick, wide, and/or continuous passivation layer 520. When the layer of dielectric material 520C is sufficiently thick to have voids (e.g., 532A and 532B) between pads (e.g., 526A to 526C), passivation cracking (e.g., between pads 526A and 526B or between pads 526B and 526C) may be effectively avoided because the stress (e.g., due to changes of temperature) can be distributed or released by the thick, wide, and/or continuous passivation layer 520.

In some embodiments, when the ratio of the width of the vias 524A, 524B, and 524C (along the x-axis) to the length of the vias 524A, 524B, and 524C (along the y-axis) does not exceed 0.34, the recesses 528A, 528B, and 528C may be narrow or elongated, and the thickness of the passivation layer 520 may be more uniform. Thus, passivation cracking (e.g., between the pads 526A and 526B or between the pads 526B and 526C) may be effectively avoided. The reasons why passivation cracking between the pads is effectively avoided include that the stress (e.g., due to changes of temperature) can be distributed or released by the thick, wide, and/or continuous passivation layer on the pads.

In some embodiments, when the ratio of the width (along the x-axis) of the vias (e.g., vias 524A, 524B, and 524C) to the width (along the x-axis) of the pads (e.g., pads 526A, 526B, and 526C) is from 0.16 to 0.48, passivation cracking (e.g., at the trench 532A or 532B) may be effectively avoided. The reasons why passivation cracking between the pads is effectively avoided include that the stress (e.g., due to changes of temperature) can be distributed or released by the thick, wide, and/or continuous passivation layer on the pads.

Similar to the semiconductor device 100, the distance may be measured from the left side of a via (e.g., one of the vias 524A, 524B, and 524C) to the left side of the corresponding pad along the width; another distance may be measured from the right side of the via to the right side of the corresponding pad along the width. In some embodiments, when the ratio of one of these two distances to the width of the via is from 0.52 to 2.5, passivation cracking (e.g., at the trench 532A or 532B) may be effectively avoided. In some embodiments, the ratio of one of these two distances to the width of the corresponding pad is from 0.25 to 0.42, passivation cracking (e.g., between the pads 526A and 526B or between the pads 526B and 526C) may be effectively avoided. The reasons why passivation cracking between the pads is effectively avoided include that the stress (e.g., due to changes of temperature) can be distributed or released by the thick, wide, and/or continuous passivation layer on the pads.

Figure 4:
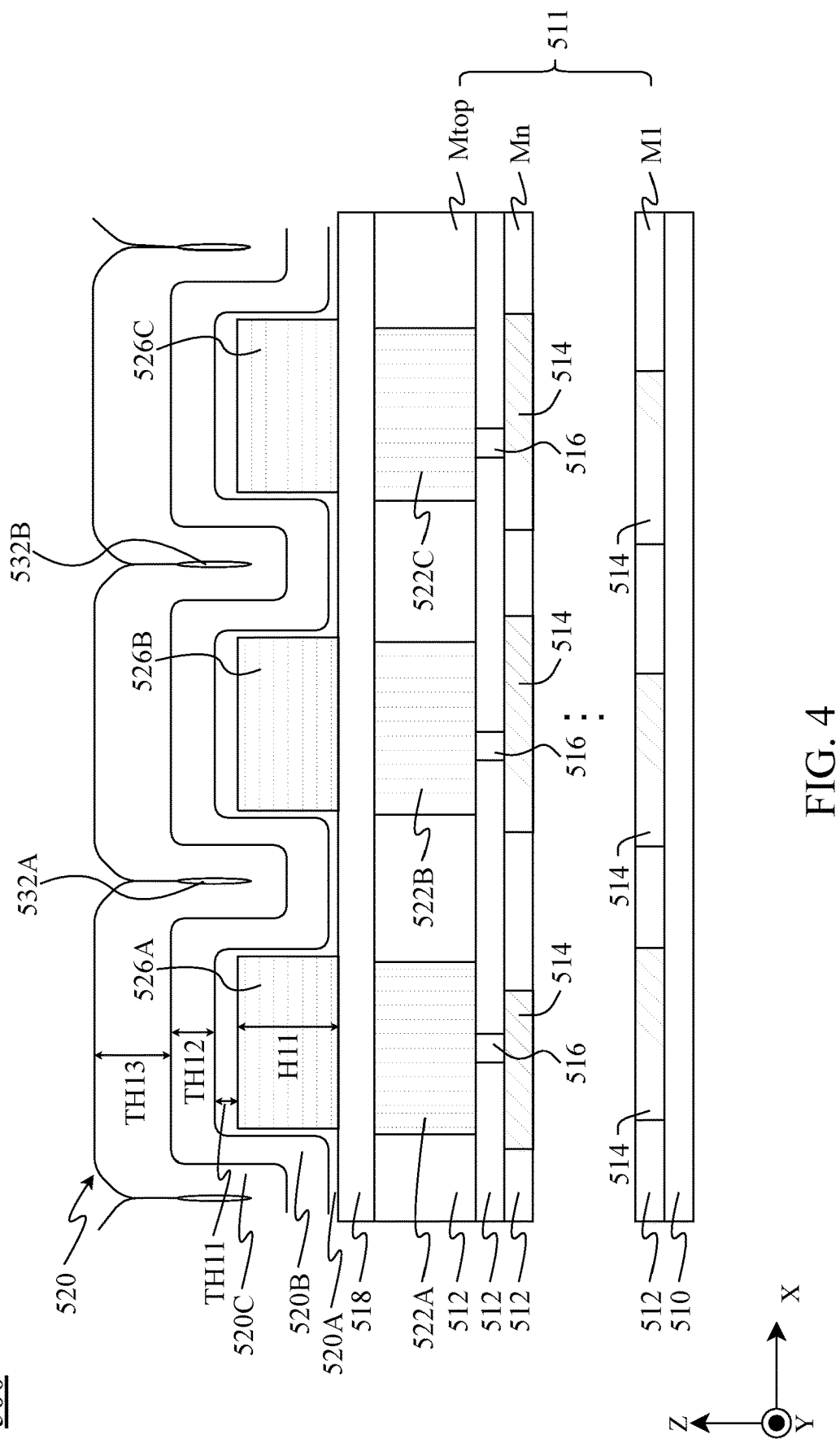
FIG. 4 is a cross-section of a semiconductor device, in accordance with some embodiments of the present disclosure.

FIG. 4 is a cross-section of the semiconductor device 500, in accordance with some embodiments of the present disclosure. The cross-section of the semiconductor device 500 shown in FIG. 4 may be observed along a line similar to the line CC' of semiconductor device 200 of FIG. 2A. No vias may appear in the cross-section of FIG. 4.

Compared with FIG. 3, the cross-section of FIG. 4 may not include the vias 524A, 524B, and 524C, the recesses 528A, 528B, and 528C, and the recesses 530A, 530B, and 530C. Because the cross-section of FIG. 4 does not include the vias 524A, 524B, and 524C, the recesses 528A, 528B, and 528C and the recesses 530A, 530B, and 530C may not be formed correspondingly.

Similar to the cross-section of FIG. 3, the pads 526A, 526B, and 526C shown in the cross-section of FIG. 4 may comprise aluminum, copper, an aluminum copper alloy, the like, or a combination thereof and may be formed to have a substantial height H11 (or a substantial thickness) between about 1.4 µm and about 2.8 µm. In one embodiment, the substantial height H11 of the pads 526A, 526B, and 526C may be 2.5 µm (e.g., semiconductor devices manufactured under a 28 nm process).

Similar to the cross-section of FIG. 3, the passivation layer 520 may include a layer of dielectric material 520A, a layer of dielectric material 520B, and a layer of dielectric material 520C. The dielectric material 520A may include undoped silicate glass (USG). The dielectric material 520B may include high density plasma (HDP) oxide (e.g., a layer of oxide formed by a HDP chemical vapor deposition). The dielectric material 520C may include silicon nitride (e.g., SiN).

The semiconductor devices of the present disclosure may be manufactured under processes of different nanometer scale. For semiconductor devices manufactured under a 28 nm process, the layer of dielectric material 520A may be formed to have a thickness TH11 about 0.2 µm. A part of the layer of dielectric material 520A on the pad 526A, 526B, or 526C may be formed to have a thickness TH11 about 0.2 µm. The layer of dielectric material 520B may be formed to have a thickness TH12 about 1.3 µm. A part of the layer of dielectric material 520B on the pad 526A, 526B, or 526C may be formed to have a thickness TH12 about 1.3 µm. The layer of dielectric material 520C may be formed to have a thickness TH13 between about 1.4 µm and about 2 µm. A part of the layer of dielectric material 520C on the pad 526A, 526B, or 526C may be formed to have a thickness TH13 between about 1.4 µm and about 2 µm. In some embodiments, the thickness TH13 may exceed 2 µm. The passivation layer 520 may be formed to have a thickness between about 2.9 µm and about 3.5 µm. A part of the passivation layer 520 on the pad 526A, 526B, or 526C may be formed to have a thickness between about 2.9 µm and about 3.5 µm. In some embodiments, the thickness of the passivation layer 520 may exceed 3.5 µm.

The voids 532A and 532B may be formed within the passivation layer 520. Because the passivation layer 520 may be grown from a partial surface of the passivation layer 518, the sidewalls of the pads 526A to 526C, and the top surfaces of the pads 526A to 526C, the voids 532A and 532B may thus be formed with the passivation layer 520. The passivation layer 520 may be substantially continuous since no obvious trenches are formed between the pads 526A, 526B and 526C.

The voids 532A and 532B may be formed within the layer of dielectric material 520C. Because the layer of dielectric material 520C may be grown from the top surfaces and sidewalls of the layer of dielectric material 520B, the voids 532A and 532B may thus be formed with the layer of dielectric material 520C. The layer of dielectric material 520C may be substantially continuous since no obvious trenches are formed between the pads 526A, 526B and 526C.

The void 532A may be formed between the pads 526A and 526B. The void 532A may be separated from the pads 532A and 532B by the same distances. The void 532A may be formed at the central point of the line connected the pads 526A and 526B. The void 532B may be formed between the pads 526B and 526C. The void 532B may be separated from the pads 532B and 532C by the same distances. The void 532B may be formed at the central point of the line connected the pads 526A and 526B.

Each of voids 532A and 532B may be shaped as fusiform when observed in the cross-section of FIG. 4. The voids 532A and 532B may be formed to have a width (e.g., along the x-direction) between about 0.13 µm and about 0.15 µm. The voids 532A and 532B may be formed to have a length between about 1.9 µm and about 2.07 µm (e.g., along the z-direction).

When the passivation layer 520 is formed to have a thickness between about 2.9 µm and about 3.5 µm or a thickness exceeding 3.5 µm, passivation cracking (e.g., between pads 526A and 526B or between pads 526B and 526C) may be effectively avoided because the stress (e.g., due to changes of temperature) can be distributed or released by the thick, wide, and/or continuous passivation layer 520. When the layer of dielectric material 520C is formed to have a thickness TH13 between about 1.4 µm and about 2 µm or a thickness TH13 exceeding 2 µm, passivation cracking (e.g., between pads 526A and 526B or between pads 526B and 526C) may be effectively avoided because the stress (e.g., due to changes of temperature) can be distributed or released by the thick, wide, and/or continuous passivation layer 520. When a ratio of the thickness TH13 to the thickness TH11 exceeds 7, passivation cracking (e.g., between pads 526A and 526B or between pads 526B and 526C) may be effectively avoided because the stress (e.g., due to changes of temperature) can be distributed or released by the thick, wide, and/or continuous passivation layer 520.

When the passivation layer 520 is sufficiently thick to have voids (e.g., 532A and 532B) between pads (e.g., 526A to 526C), passivation cracking (e.g., between pads 526A and 526B or between pads 526B and 526C) may be effectively avoided because the stress (e.g., due to changes of temperature) can be distributed or released by the thick, wide, and/or continuous passivation layer 520. When the layer of dielectric material 520C is sufficiently thick to have voids (e.g., 532A and 532B) between pads (e.g., 526A to 526C), passivation cracking (e.g., between pads 526A and 526B or between pads 526B and 526C) may be effectively avoided because the stress (e.g., due to changes of temperature) can be distributed or released by the thick, wide, and/or continuous passivation layer 520.

Table 1 shows the probability of passivation cracking in different cases. In the cases shown, the passivation layer (e.g., the passivation layer 520) may be formed to have a normal thickness. For example, the passivation layer of the cases in Table 1 may be formed to have a thickness about 2.5 µm (e.g., semiconductor devices manufactured under a 28 nm process). In some embodiments, the passivation layer of the cases in Table 1 may be formed to include a SiN layer having a thickness about 1 µm (e.g., semiconductor devices manufactured under a 28 nm process). The leftmost column shows the different widths of the vias, e.g., the widths of the vias 111, 112, 121, and 122 or the widths of the vias 524A, 524B, and 524C). The second column shows different parallel run lengths, e.g., the lengths of pads 110 and 120 or the lengths the pads 526A, 526B, and 526C. The first row shows different spacings between pads e.g., the spacing of pads 110 and 120 or the spacing of pads 526A, 526B, and 526C. The third to fifth columns show the probability of passivation cracking under different conditions. In general, when the parallel run length increases, the probability increases. When the spacing between pads decreases, the probability may increase. When the width of the vias between pads decreases, the probability may decrease. In some embodiments, even though the width of the vias decreases, the length of the vias may increase to keep the area the same and keep conductivity unchanged.

TABLE 1

Normal Passivation Layer

| Width of the vias (μm) | Parallel run length (μm) | Spacing between pads (μm) | | |
|---|---|---|---|---|
| | | 1.8 | 2 | 2.2 |
| 2.7 | 50 | 33.6% | 14.7% | 5.2% |
| | 75 | 40.5% | 24.1% | 14.7% |
| | 100 | 57.8% | 30.2% | 15.5% |
| | 200 | 62.1% | 37.9% | 22.4% |
| | 400 | 73.3% | 52.6% | 39.7 |
| | 500 | 69.8% | 49.1% | 43.1% |
| | 600 | 66.4% | 41.4% | 37.7% |
| 1.5 | 50 | 0.0% | 0.0% | 0.0% |
| | 75 | 0.4% | 0.0% | 0.0% |
| | 100 | 3.9% | 0.4% | 1.3% |
| | 200 | 3.9% | 0.4% | 0.0% |
| | 400 | 6.9% | 3.0% | 0.0% |
| | 500 | 6.5% | 4.3% | 2.6% |
| | 600 | 7.8% | 1.7% | 0.9% |
| 1 | 50 | 0.0% | 0.0% | 0.0% |
| | 75 | 0.9% | 0.0% | 0.0% |
| | 100 | 5.6% | 1.3% | 0.0% |
| | 200 | 9.9% | 3.9% | 0.4% |
| | 400 | 17.2% | 9.1% | 0.4% |
| | 500 | 24.6% | 6.0% | 0.0% |
| | 600 | 16.8% | 8.6% | 0.0% |

Table 2 shows the probability of passivation cracking in other cases. With respect to the cases shown in Table 1, the passivation layer (e.g., the passivation layer 520) of the cases shown in Table 2 may be formed to be thicker. For example, the passivation layer of the cases in Table 2 may be formed have a thickness about 3.5 μm (e.g., semiconductor devices manufactured under a 28 nm process). In some embodiments, a portion of the passivation layer of the cases in Table 2 may be formed to include a SiN layer having a thickness about 2 μm (e.g., semiconductor devices manufactured under a 28 nm process), such as the layer of dielectric material 520C. Compared with Table 1, under the same width of the vias, same PRL, and same spacing between pads, the probabilities of passivation cracking shown in Table 2 are much lower than those shown in Table 1. Thus, increasing the thickness of the passivation layer (e.g., the passivation layer 520) and/or the thickness of the layer of dielectric material 520C can decrease the probability of passivation cracking.

TABLE 2

Thicker Passivation Layer

| Width of the vias (μm) | Parallel run length (μm) | Spacing between pads (μm) | | |
|---|---|---|---|---|
| | | 1.8 | 2 | 2.2 |
| 2.7 | 50 | 0.9% | 0% | 0% |
| | 75 | 0% | 0% | 0% |
| | 100 | 0.9% | 0.9% | 0.9% |
| | 200 | 0.9% | 0% | 0% |
| | 400 | 1.7% | 0% | 0% |
| | 500 | 1.7% | 0% | 0% |
| | 600 | 1.7% | 2.6% | 0% |
| 1.5 | 50 | 0% | 0% | 0% |
| | 75 | 0% | 0% | 0% |
| | 100 | 0% | 0% | 0% |
| | 200 | 0% | 0% | 0% |
| | 400 | 0% | 0% | 0% |
| | 500 | 0% | 0% | 0% |
| | 600 | 0.9% | 0% | 0% |

TABLE 2-continued

Thicker Passivation Layer

| Width of the vias (μm) | Parallel run length (μm) | Spacing between pads (μm) | | |
|---|---|---|---|---|
| | | 1.8 | 2 | 2.2 |
| 1 | 50 | 0% | 0% | 0% |
| | 75 | 0% | 0% | 0% |
| | 100 | 0% | 0% | 0% |
| | 200 | 0% | 0% | 0% |
| | 400 | 0% | 0% | 0% |
| | 500 | 0% | 0% | 0% |
| | 600 | 0.9% | 0% | 0% |

Table 3 shows the probability of passivation cracking in different cases. In the cases shown in Table 3, different spacing between two pads (e.g., 526A to 526C) and different thickness of the layer of dielectric material 520C are discussed. The dielectric material 520C may include SiN. The first column shows different spacings between two pads. The second column shows the probabilities of passivation cracking with the layer of dielectric material 520C having a thickness of 1 μm under different spacings between two pads. The third column shows the probabilities of passivation cracking with the layer of dielectric material 520C having a thickness of 1.4 μm under different spacings between two pads. The fourth column shows the probabilities of passivation cracking with the layer of dielectric material 520C having a thickness of 1.6 μm under different spacings between two pads. The fifth column shows the probabilities of passivation cracking with the layer of dielectric material 520C having a thickness of 1.8 μm under different spacings between two pads. The sixth column shows the probabilities of passivation cracking with the layer of dielectric material 520C having a thickness of 2 μm under different spacings between two pads. In the cases shown in Table 3, other dielectric materials included in the passivation layer (e.g., dielectric material 520A and 520B) may keep the same thickness. The passivation layer (e.g., the passivation layer 520) may be formed to have a thickness between about 2.5 μm and about 3.5 μm (e.g., semiconductor devices manufactured under a 28 nm process). The thickness of the layer of dielectric material 520C may be measured for the part on the pad 526A, 526B, or 526C. The thickness of the passivation layer (e.g., the passivation layer 520) may be measured for the part on the pad 526A, 526B, or 526C.

In general, when the spacing decreases, the probability of passivation cracking increases. When the thickness of the layer of dielectric material 520C increases, the probability of passivation cracking may decrease. When the thickness of the passivation layer (e.g., the passivation layer 520) increases, the probability of passivation cracking may decrease. When the spacing between two pads is narrower, the layer of dielectric material 520C (or the passivation layer 520) may be thicker so as to be free of passivation cracking.

TABLE 3

| Spacing between pads (μm) | Dielectric material 520C of 1 μm | Dielectric material 520C of 1.4 μm | Dielectric material 520C of 1.6 μm | Dielectric material 520C of 1.8 μm | Dielectric material 520C of 2 μm |
|---|---|---|---|---|---|
| 2.09 | 5% | 0% | 0.0% | 0.0% | 0.0% |
| 2.03 | 5% | 0% | 0.0% | 0.0% | 0.0% |
| 1.97 | 2.2% | 1.1% | 0.0% | 0.0% | 0.0% |
| 1.91 | 13.0% | 1.1% | 0.0% | 0.0% | 0.0% |
| 1.85 | 8% | 2.2% | 0.0% | 0.0% | 0.0% |

TABLE 3-continued

| Spacing between pads (μm) | Dielectric material 520C of 1 μm | Dielectric material 520C of 1.4 μm | Dielectric material 520C of 1.6 μm | Dielectric material 520C of 1.8 μm | Dielectric material 520C of 2 μm |
|---|---|---|---|---|---|
| 1.79 | 11% | 0% | 1.1% | 0.0% | 0.0% |
| 1.73 | 26% | 1.1% | 0.0% | 0.0% | 0.0% |
| 1.67 | 33% | 2.2% | 0.0% | 0.0% | 0.0% |
| 1.61 | 29% | 2.2% | 1.1% | 1.1% | 0.0% |

FIGS. 5 to 9 illustrate various stages of manufacturing the semiconductor device 500, in accordance with some embodiments of the present disclosure.

Figure 5:
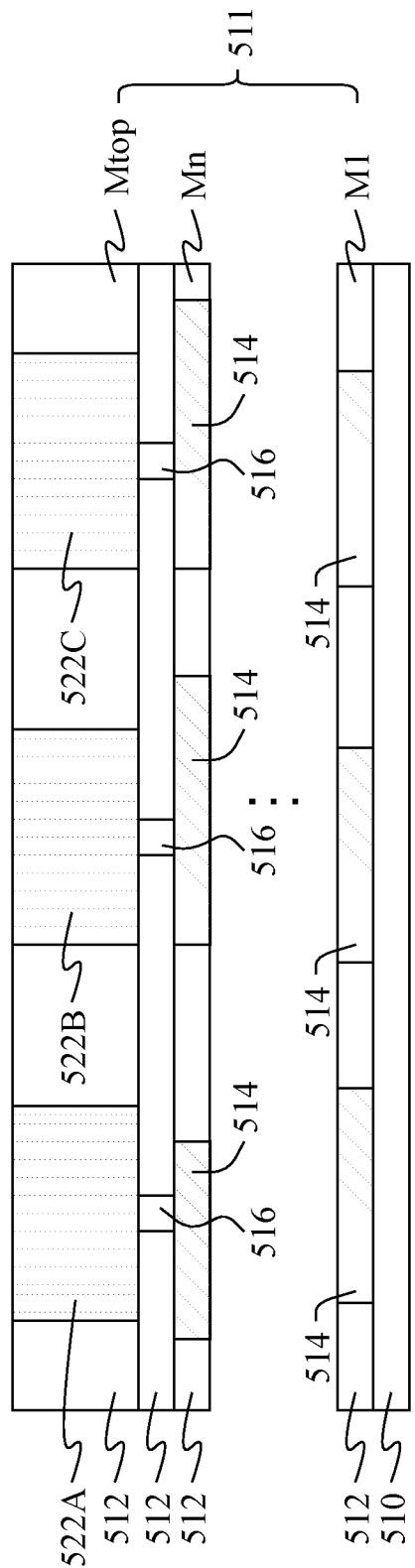
FIGS. 5 to 9 illustrate various stages of manufacturing a semiconductor device, in accordance with some embodiments of the present disclosure.

FIG. 5 illustrates a substrate 510 and metal layers M1 through Mtop at an intermediate stage of processing. The substrate 510 may be silicon, SiGe, silicon carbide, the like, or a combination thereof. The substrate 510 may comprise bulk silicon, doped or undoped, or an active layer of a silicon-on-insulator (SOI) substrate. Other substrates that may be used include multi-layered substrates, gradient substrates, or hybrid orientation substrates.

The substrate 510 may include integrated circuits comprising active and passive devices (not shown). As one of ordinary skill in the art could recognize, a wide variety of active and passive devices such as transistors, capacitors, resistors, combinations of these, or the like may be used to generate the structural and functional requirements of the design for the semiconductor device 500. The integrated circuits comprising active and passive devices may be formed using any suitable methods.

As shown in FIG. 5, the IMDs 512 and metal lines 514 and vias 516 may be formed over the substrate 510. In an embodiment, the metal lines 514 and vias 516 may be coupled to the integrated circuits on the substrate 510 to allow other devices to be coupled to the integrated circuits. Each of the IMDs 512 can be silicon oxide, BPSG, PSG, FSG, the like, or a combination thereof, formed by chemical vapor deposition (CVD), high-density plasma CVD (HDP-CVD), furnace deposition, plasma-enhanced CVD (PECVD), the like, or a combination thereof. The metal lines 514 and vias 516 in each of the IMDs 512 may be formed using, for example, a damascene process like a dual damascene and may comprise aluminum, or copper aluminum alloys, the like, or a combination thereof. The metal lines 514 and the vias 516 may be deposited using, for example, CVD, atomic layer deposition (ALD), physical vapor deposition (PVD), the like, or a combination thereof. A polishing and/or grinding process, such as chemical mechanical polishing (CMP), may remove excess conductive materials. The IMDs 512 may be sequentially formed, along with the respective vias 516 and metal lines 514.

The metal contacts 522A, 522B, and 522C may be formed over the metal lines 514 and vias 516. The metal contacts 522A, 522B, and 522C may comprise copper, aluminum, aluminum copper, tungsten, nickel, the like, or a combination thereof and may be formed by a similar process as the metal lines 514 as described. In another embodiment, the metal contacts 522A, 522B, and 522C may be formed and patterned before the formation of the top IMD 512. The metal contacts 522A, 522B, and 522C may be a top metal or an UTM. An UTM may be formed at a thickness of about 3 times the thickness of a typical top metal or about 10 times the thickness of the other metal layers Mn and M1. In another embodiment, the metal contacts 522A, 522B, and 522C may be a similar thickness to the other metal layers Mn through M1. It should be noted that many other components may be included in an embodiment that are not expressly depicted. For example, etch stop layers can be disposed between the various interfaces between layers of the substrate 510 and IMDs 512. Further, more or fewer IMDs 512 and metal layers may be used.

Figure 6:
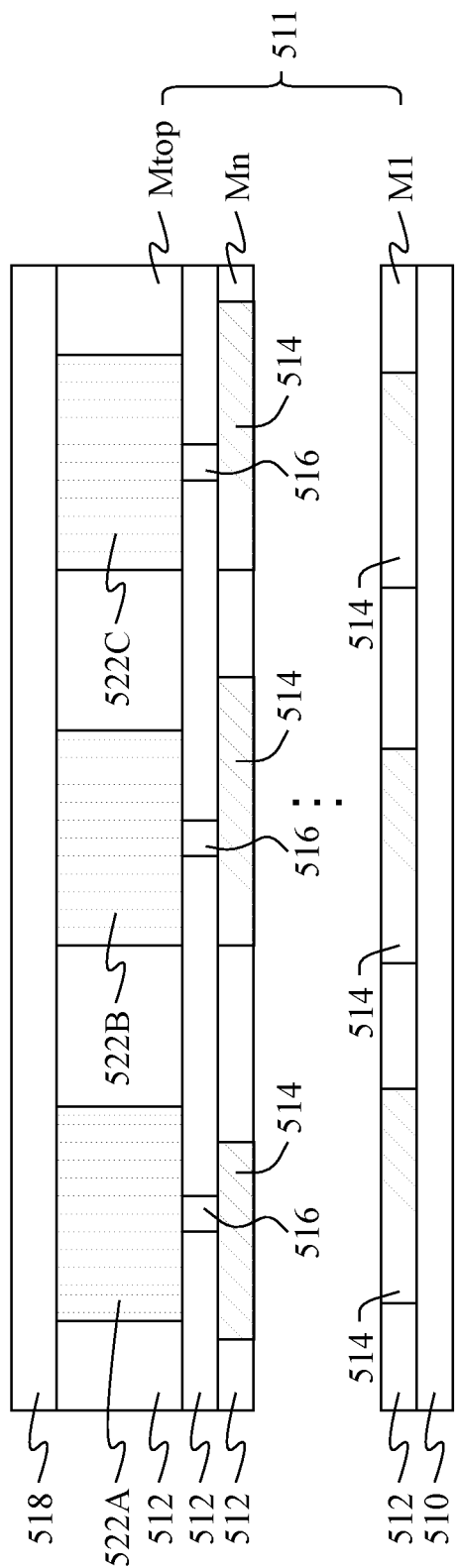

In FIG. 6, the formation of the passivation layer 518 is illustrated. The passivation layer 518 may be formed over the metal contacts 522A, 522B, and 522C and the top IMD 512. The passivation layer 518 can be silicon nitride, silicon carbide, silicon oxide, low-k dielectrics such as carbon doped oxides, extremely low-k dielectrics such as porous carbon doped silicon dioxide, the like, or a combination thereof, and deposited by CVD or the like.

Figure 7:
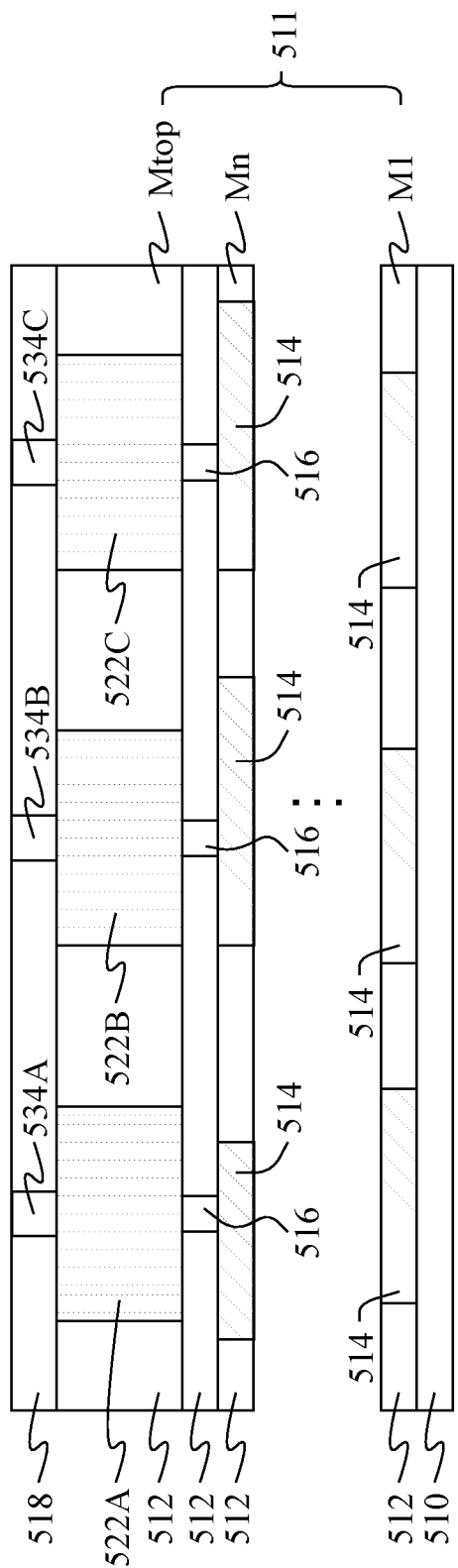

FIG. 7 illustrates the formation of openings 534A, 534B, and 534C on the passivation layer 518. The openings 534A, 534B, and 534C may be formed through the passivation layer 518 by removing portions of the passivation layer 518 to expose at least a portion of the underlying metal contacts 522A, 522B, and 522C. The vias 524A, 524B, and 524C may allow contact to the metal contacts 522A, 522B, and 522C, respectively. The openings 534A, 534B, and 534C may be formed using a suitable photolithographic mask and etching process, although any suitable process to expose portions of the metal contacts 522A, 522B, and 522C may be used.

Figure 8:
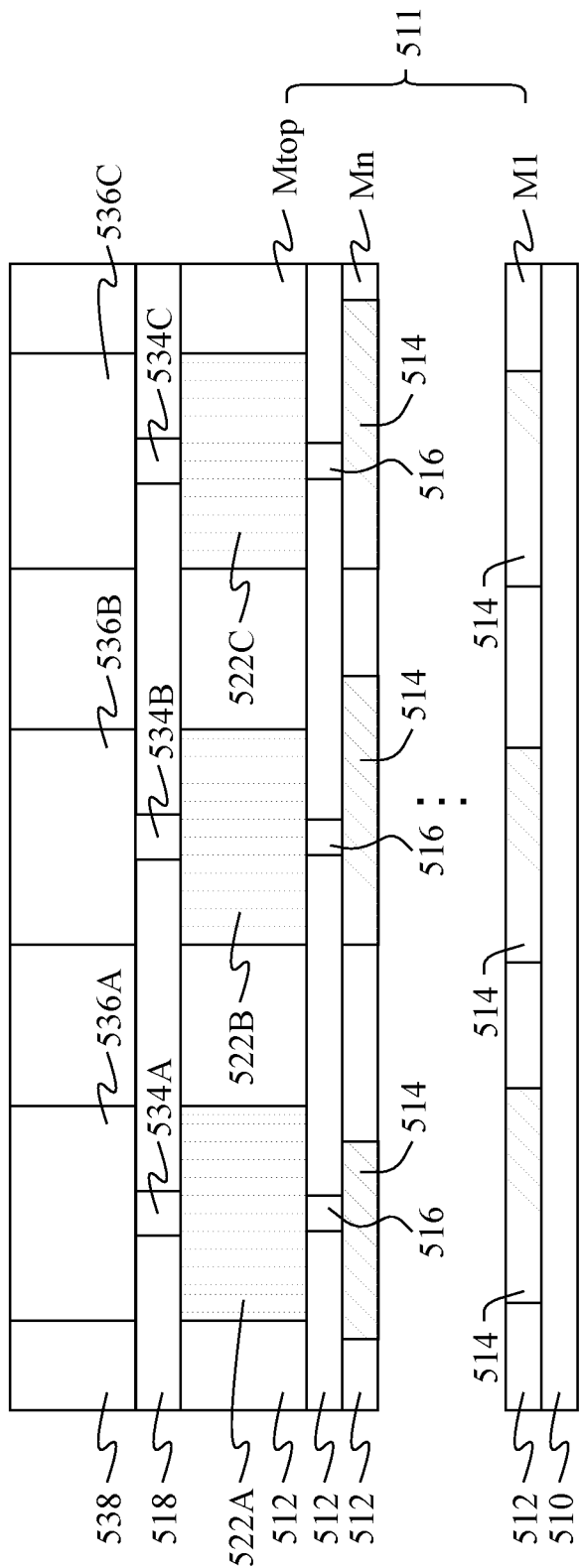

In FIG. 8, openings 536A, 536B, and 536C for the pads 526A, 526B, and 526C may be formed in a photoresist layer 538. The photoresist layer 538 may be removed over the vias 524A, 524B, and 524C and the pads 526A, 526B, and 526C are formed.

In some embodiments, one or more barrier layers (not shown) may be formed at the bottom of the openings 534A, 534B, and 534C comprising titanium, titanium nitride, tantalum, tantalum nitride, the like, or a combination thereof. The one or more barrier layers may be formed along the passivation layer 518 and at the bottom of the openings 534A, 534B, and 534C by CVD, PVD, PECVD, ALD, the like, or a combination thereof. In an embodiment, the photoresist layer 538 may cover a seed layer (not shown) of a titanium copper alloy on one or more barrier layers, if present, through CVD, sputtering, the like, or a combination thereof.

Figure 9:
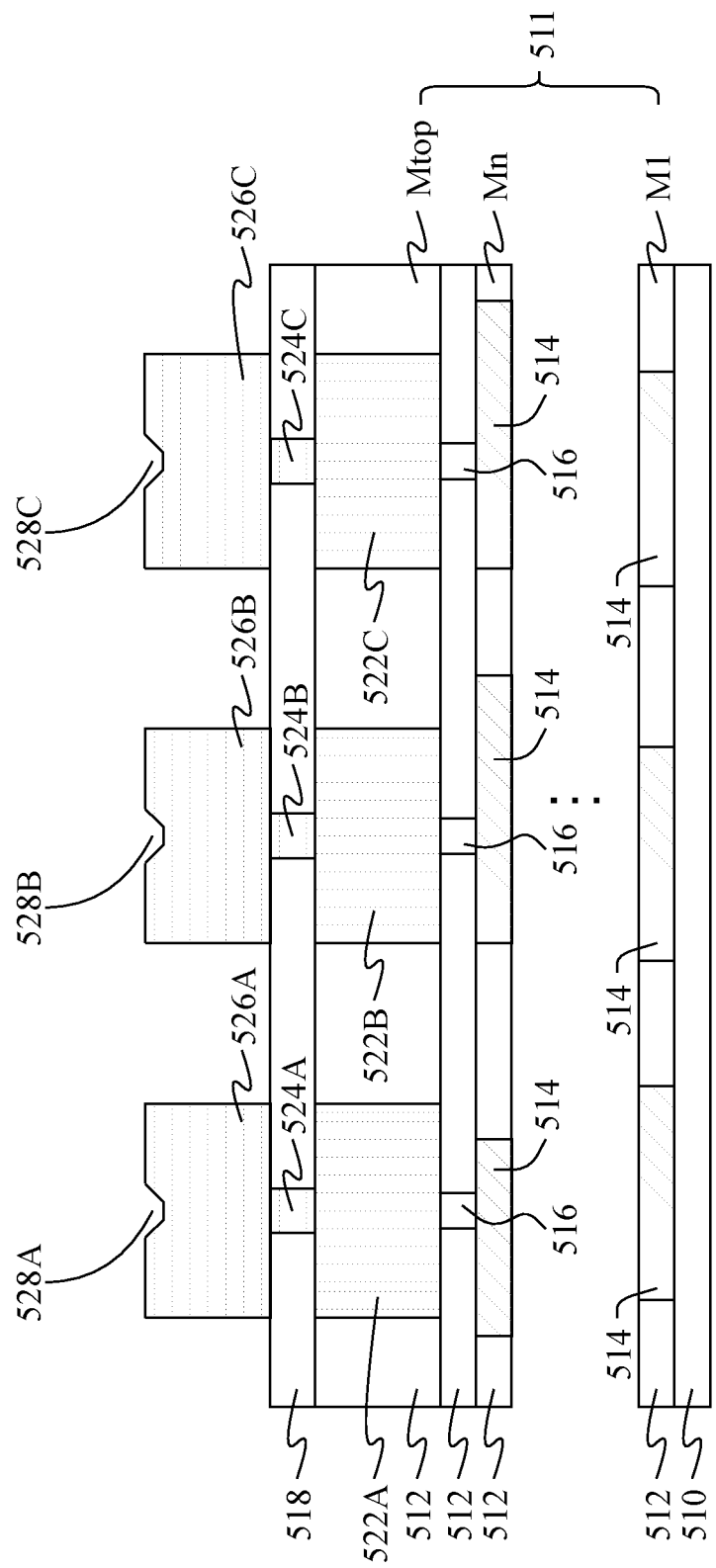

In FIG. 9, the formation of the vias 524A, 524B, and 524C and the pads 526A, 526B, and 526C is illustrated. The vias 524A and pad 526A may be formed in the openings 534A and 536A in a single process (e.g., a deposition process). The vias 524B and pad 526B may be formed in the openings 534B and 536B in a single process (e.g., a deposition process). The vias 524C and pad 526C may be formed in the openings 534C and 536C in a single process (e.g., a deposition process). After the vias 524A, 524B, and 524C and the pads 526A, 526B, and 526C are formed, the photoresist layer 538 may be removed.

In an embodiment, the vias 524A, 524B, and 524C and the pads 526A, 526B, and 526C may be formed by forming a seed layer (not shown) of a titanium copper alloy on the one or more barrier layers, if present, through CVD, sputtering, the like, or a combination thereof. The photoresist layer 538 may then be formed to cover the seed layer, and the photoresist may then be patterned to expose those portions of the seed layer that are located where the pads 526A, 526B, and 526C are to be located. Once the photoresist layer 538 has been formed and patterned, a conductive material, such as copper, aluminum, aluminum copper, gold, the like or a combination thereof may be formed on the seed layer through deposition such as plating, CVD, PVD, the like, or a combination thereof. Once the conductive material has been formed, the photoresist layer 538 may be removed through a suitable removal process such as ashing. Additionally, after the removal of the photoresist, those portions of the seed layer that were covered by the photoresist may be removed through, for example, a suitable etching process using the conductive material as a mask.

FIG. 9 illustrates the removal of the photoresist layer 538 after the formation of the vias 524A, 524B, and 524C and the pads 526A, 526B, and 526C.

In some embodiments, a ratio of the width of the via 524A to the length of the via 524A may not exceed 0.34. A ratio of the width of the via 524B to the length of the via 524B may not exceed 0.34. A ratio of the width of the via 524C to the length of the via 524C may not exceed 0.34.

In some embodiments, a ratio of the width of the via 524A to the width of the pad 526A may be between 0.16 and 0.48. A ratio of the width of the via 524B to the width of the pad 526B may be between 0.16 and 0.48. A ratio of the width of the via 524C to the width of the pad 526C may be between 0.16 and 0.48.

In some embodiments, along the width of the pad 526A, a first distance may be measured between the boundary of the pad 526A and the boundary of the via 524A on the same side (e.g., on the right side or on the left side). A ratio of the first distance to the width of the via 524A may be between 0.52 and 2.5. A second distance may be measured between the boundary of the pad 526B and the boundary of the via 524B on the same side (e.g., on the right side or on the left side). A ratio of the second distance to the width of the via 524B may be between 0.52 and 2.5. A third distance may be measured between the boundary of the pad 526C and the boundary of the via 524C on the same side (e.g., on the right side or on the left side). A ratio of the third distance to the width of the via 524C may be between 0.52 and 2.5.

After the removal of the photoresist layer 538, the passivation layer 520 may be formed on the pads 526A, 526B, and 526C and the passivation layer 518. The passivation layer 520 may comprise high density plasma (HDP) oxide (e.g., a layer of oxide formed by a HDP chemical vapor deposition), undoped silicate glass (USG), fluorinated silicate glass (FSG), silicon oxide (e.g., SiOx), silicon nitride (e.g., SiN), the like, or a combination thereof. The passivation layer 520 may be conformally deposited, by CVD or the like, over the pads 526A, 526B, and 526C and the passivation layer 518 to have the substantially same thickness across the semiconductor device 500. After the passivation layer 520 is formed, the semiconductor device 500 as shown in FIG. 3 may be formed.

Figure 10:
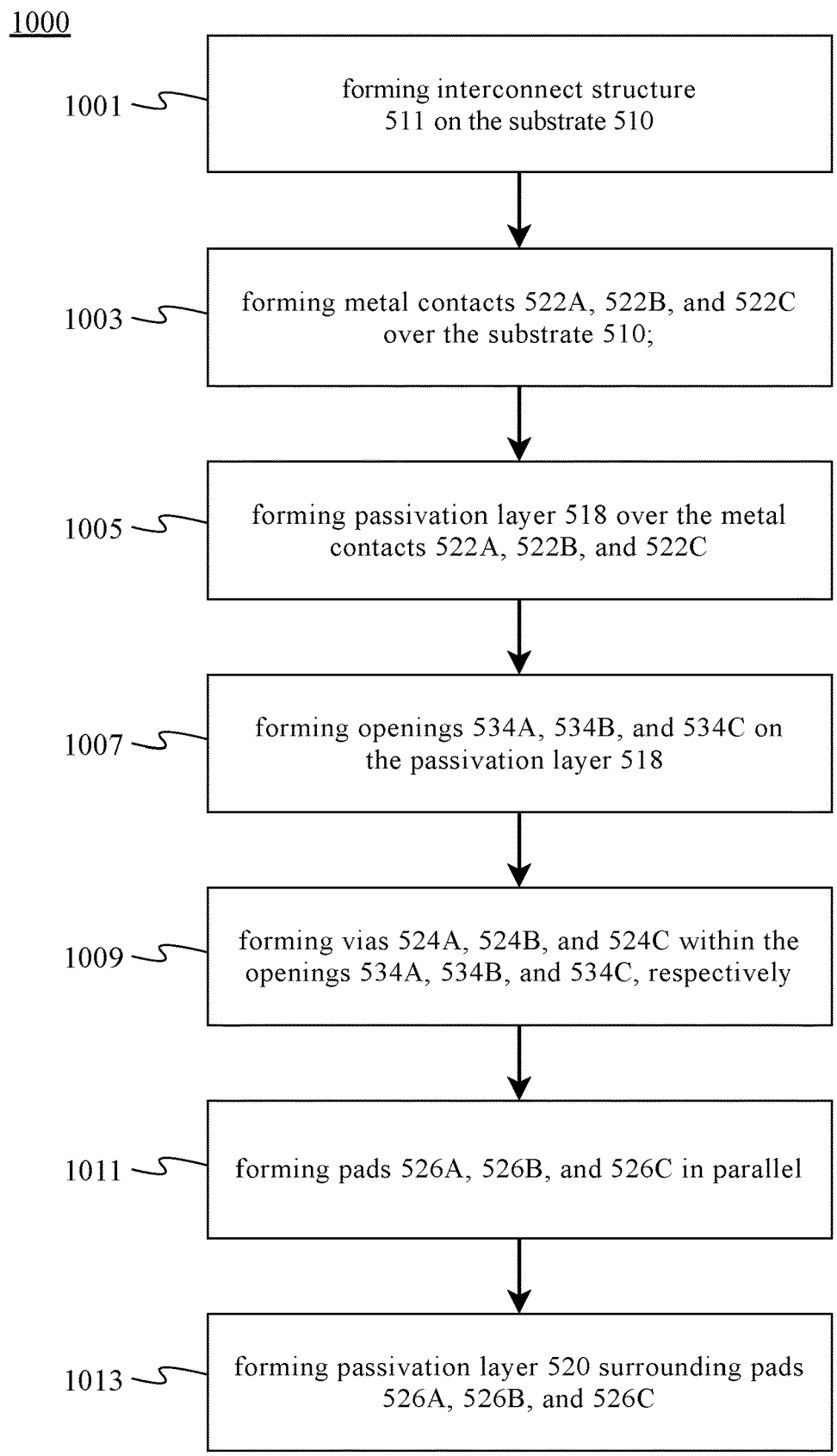
FIG. 10 is a flowchart illustrating a method of manufacturing a semiconductor device, in accordance with some embodiments of the present disclosure.

FIG. 10 is a flowchart illustrating a method 1000 for manufacturing the semiconductor device 500 in accordance with some embodiments of the present disclosure.

In operation 1001, the interconnect structure 511 may be formed on the substrate 510. The interconnect structure 511 comprises metal lines 514 and vias 516 to electrically connect the various active devices and/or passive devices to form functional circuitry or an integrated circuit.

In operation 1003, the metal contacts 522A, 522B, and 522C may be formed over the substrate 510. The metal contacts 522A, 522B, and 522C may be formed over and in electrical contact with the interconnect structure 511.

In operation 1005, the passivation 518 may be formed over the metal contacts 522A, 522B, and 522C. The passivation layer 518 may be formed over the interconnect structure 511 and the metal contacts 522A, 522B, and 522C.

In operation 1007, the openings 534A, 534B, and 534C may be formed on the passivation layer 518. The openings 534A, 534B, and 534C may be formed through the passivation layer 518 by removing portions of the passivation layer 518 to expose at least a portion of the underlying metal contacts 522A, 522B, and 522C.

In operation 1009, the vias 524A, 524B, and 524C may be formed within the openings 534A, 534B, and 534C, respectively. The via 524A may allow contact between the metal contact 522A and the pad 526A. The via 524B may allow contact between the metal contact 522B and the pad 526B. The via 524C may allow contact between the metal contact 522C and the pad 526C, wherein a ratio of the width of the vias 524A, 524B, and 524C to the length of the vias 524A, 524B, and 524C does not exceed 0.34.

In operation 1011, the pads 526A, 526B, and 526C may be formed in parallel. The pad 526A may connect to the metal contact 522A through the via 524A. The pad 526B may connect to the metal contact 522B through the via 524B. The pad 526B may connect to the metal contact 522B through the via 524B. The via 524A and the pad 526A may be formed in a single process (e.g., a deposition process). The via 524B and the pad 526B may be formed in a single process (e.g., a deposition process). The via 524C and the pad 526C may be formed in a single process (e.g., a deposition process).

After the formation of the pads 526A, 526B, and 526C, the passivation layer 520 may be formed in operation 1013. The passivation layer 520 may surround and cover the pads 526A, 526B, and 526C. The passivation layer 520 may be substantially continuous since no obvious trenches are formed between the pads 526A, 526B and 526C.

The passivation layer 520 may include a layer of dielectric material 520A, a layer of dielectric material 520B, and a layer of dielectric material 520C. The dielectric material 520A may include undoped silicate glass (USG). The dielectric material 520B may include high density plasma (HDP) oxide (e.g., a layer of oxide formed by a HDP chemical vapor deposition). The dielectric material 520C may include silicon nitride (e.g., SiN). The layer of dielectric material 520C may be substantially continuous since no obvious trenches are formed between the pads 526A, 526B and 526C.

The layer of dielectric material 520A may be formed to have a thickness TH11 about 0.2 µm. A part of the layer of dielectric material 520A on the pad 526A, 526B, or 526C may be formed to have a thickness TH11 about 0.2 µm. The layer of dielectric material 520B may be formed to have a thickness TH12 about 1.3 µm. A part of the layer of dielectric material 520B on the pad 526A, 526B, or 526C may be formed to have a thickness TH12 about 1.3 µm. The layer of dielectric material 520C may be formed to have a thickness TH13 between about 1.4 µm and about 2 µm. A part of the layer of dielectric material 520C on the pad 526A, 526B, or 526C may be formed to have a thickness TH13 between about 1.4 µm and about 2 µm. In some embodiments, the thickness TH13 may exceed 2 µm. The passivation layer 520 may be formed to have a thickness between about 2.9 µm and about 3.5 µm. A part of the passivation layer 520 on the pad 526A, 526B, or 526C may be formed to have a thickness between about 2.9 µm and about 3.5 µm. In some embodiments, the thickness of the passivation layer 520 may exceed 3.5 µm.

The voids 532A and 532B may be formed within the passivation layer 520. The voids 532A and 532B may be formed within the layer of dielectric material 520C. The void 532A may be formed between the pads 526A and 526B. The void 532A may be separated from the pads 532A and 532B by the same distances. The void 532A may be formed at the central point of the line connected the pads 526A and

526B. The void 532B may be formed between the pads 526B and 526C. The void 532B may be separated from the pads 532B and 532C by the same distances. The void 532B may be formed at the central point of the line connected the pads 526A and 526B.

When the passivation layer 520 is formed to have a thickness between about 2.9 μm and about 3.5 μm or a thickness exceeding 3.5 μm, passivation cracking (e.g., between pads 526A and 526B or between pads 526B and 526C) may be effectively avoided. When the layer of dielectric material 520C is formed to have a thickness TH13 between about 1.4 μm and about 2 μm or a thickness TH13 exceeding 2 μm, passivation cracking (e.g., between pads 526A and 526B or between pads 526B and 526C) may be effectively avoided. When a ratio of the thickness TH13 to the thickness TH11 exceeds 7, passivation cracking (e.g., between pads 526A and 526B or between pads 526B and 526C) may be effectively avoided. The reasons why passivation cracking between the pads is effectively avoided include that the stress (e.g., due to changes of temperature) can be distributed or released by the thick, wide, and/or continuous passivation layer on the pads.

When the passivation layer 520 is sufficiently thick to have voids (e.g., 532A and 532B) between pads (e.g., 526A to 526C), passivation cracking (e.g., between pads 526A and 526B or between pads 526B and 526C) may be effectively avoided. When the layer of dielectric material 520C is sufficiently thick to have voids (e.g., 532A and 532B) between pads (e.g., 526A to 526C), passivation cracking (e.g., between pads 526A and 526B or between pads 526B and 526C) may be effectively avoided. The reasons why passivation cracking between the pads is effectively avoided include that the stress (e.g., due to changes of temperature) can be distributed or released by the thick, wide, and/or continuous passivation layer on the pads.

In some embodiments, a ratio of the width of the via 524A to the length of the via 524A may not exceed 0.34. A ratio of the width of the via 524B to the length of the via 524B may not exceed 0.34. A ratio of the width of the via 524C to the length of the via 524C may not exceed 0.34.

In some embodiments, a ratio of the width of the via 524A to the width of the pad 526A may be between 0.16 and 0.48. A ratio of the width of the via 524B to the width of the pad 526B may be between 0.16 and 0.48. A ratio of the width of the via 524C to the width of the pad 526C may be between 0.16 and 0.48.

In some embodiments, along the width of the pad 526A, a first distance may be measured between the boundary of the pad 526A and the boundary of the via 524A on the same side (e.g., on the right side or on the left side). A ratio of the first distance to the width of the via 524A may be between 0.52 and 2.5. A second distance may be measured between the boundary of the pad 526B and the boundary of the via 524B on the same side (e.g., on the right side or on the left side). A ratio of the second distance to the width of the via 524B may be between 0.52 and 2.5. A third distance may be measured between the boundary of the pad 526C and the boundary of the via 524C on the same side (e.g., on the right side or on the left side). A ratio of the third distance to the width of the via 524C may be between 0.52 and 2.5.

Figure 11:
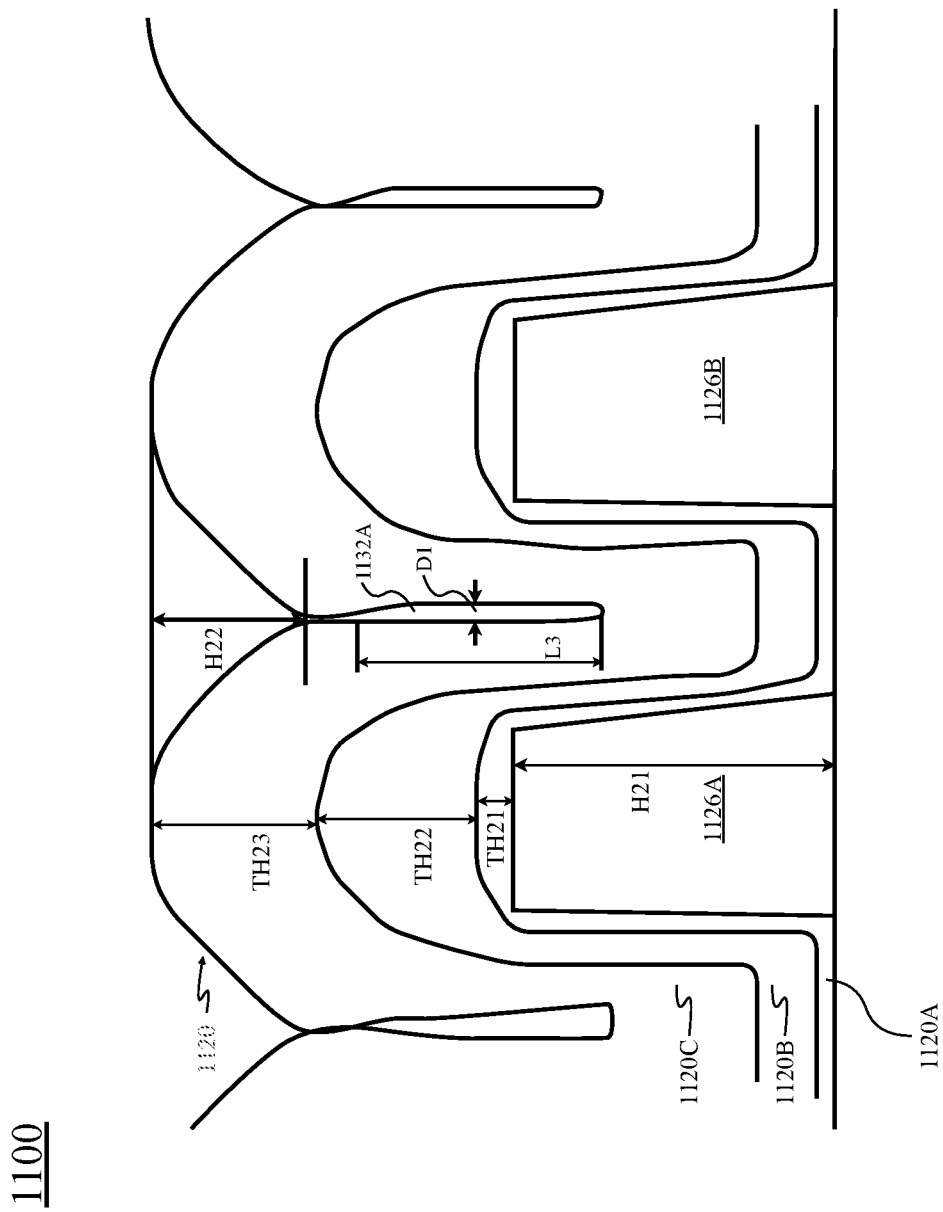
FIG. 11 is a cross-section of a semiconductor device, in accordance with some embodiments of the present disclosure.

FIG. 11 is a cross-section of the semiconductor device 1100, in accordance with some embodiments of the present disclosure. The cross-section of the semiconductor device 1100 shown in FIG. 11 may be observed along a line similar to the line CC' of semiconductor device 200 of FIG. 2A. No vias may appear in the cross-section of FIG. 11.

The semiconductor device 1100 may be similar to the semiconductor device 500 shown in FIG. 4. The semiconductor device 1100 may include pads 1126A and 1126B, passivation layer 1120, and void 1132A.

The pads 1126A and 1126B shown in the cross-section of FIG. 11 may comprise aluminum, copper, an aluminum copper alloy, the like, or a combination thereof and may be formed to have a substantial height H21 between about 1.4 μm and about 2.8 μm. In one embodiment, the substantial height H21 of the pads 1126A and 1126B may be 2.5 μm (e.g., semiconductor devices manufactured under a 28 nm process).

The passivation layer 1120 may include a layer of dielectric material 1120A, a layer of dielectric material 1120B, and a layer of dielectric material 1120C. The dielectric material 1120A may include undoped silicate glass (USG). The dielectric material 1120B may include high density plasma (HDP) oxide (e.g., a layer of oxide formed by a HDP chemical vapor deposition). The dielectric material 1120C may include silicon nitride (e.g., SiN).

The semiconductor devices of the present disclosure may be manufactured under processes of different nanometer scale. For semiconductor devices manufactured under a 28 nm process, the layer of dielectric material 1120A may be formed to have a thickness TH21 about 0.2 μm. A part of the layer of dielectric material 1120A on the pad 1126A or 1126B may be formed to have a thickness TH21 about 0.2 μm. The layer of dielectric material 1120B may be formed to have a thickness TH22 about 1.3 μm. A part of the layer of dielectric material 1120B on the pad 1126A or 1126B may be formed to have a thickness TH22 about 1.3 μm. The layer of dielectric material 1120C may be formed to have a thickness TH23 of about 1.4 μm. A part of the layer of dielectric material 1120C on the pad 1126A or 1126B may be formed to have a thickness TH23 of about 1.4 μm. The passivation layer 1120 may be formed to have a thickness of about 2.9 μm. A part of the passivation layer 1120 on the pad 1126A or 1126B may be formed to have a thickness of about 2.9 μm.

The passivation layer 1120 may be substantially continuous since no obvious trenches are formed between the pads 1126A and 1126B. The layer of dielectric material 1120C may be substantially continuous since no obvious trenches are formed between the pads 1126A and 1126B. The profile of the top surface of the passivation layer 1120 may be formed to have a top point and a bottom point. The height H22 from the bottom point to the top point may be about 1.49 μm.

The void 1132A may be formed within the passivation layer 1120. The void 1132A may be formed within the layer of dielectric material 1120C. The void 1132A may be formed between the pads 1126A and 1126B. The void 1132A may be separated from the pads 1132A and 1132B by the same distances. The void 1132A may be formed at the central point of the line connected the pads 1126A and 1126B. The void 1132A may be shaped as fusiform. The semiconductor devices of the present disclosure may be manufactured under processes of different nanometer scale. For semiconductor devices manufactured under a 28 nm process, the void 1132A may be formed to have a length L3 about 2.07 μm and a width D1 about 0.15 μm.

Figure 12:
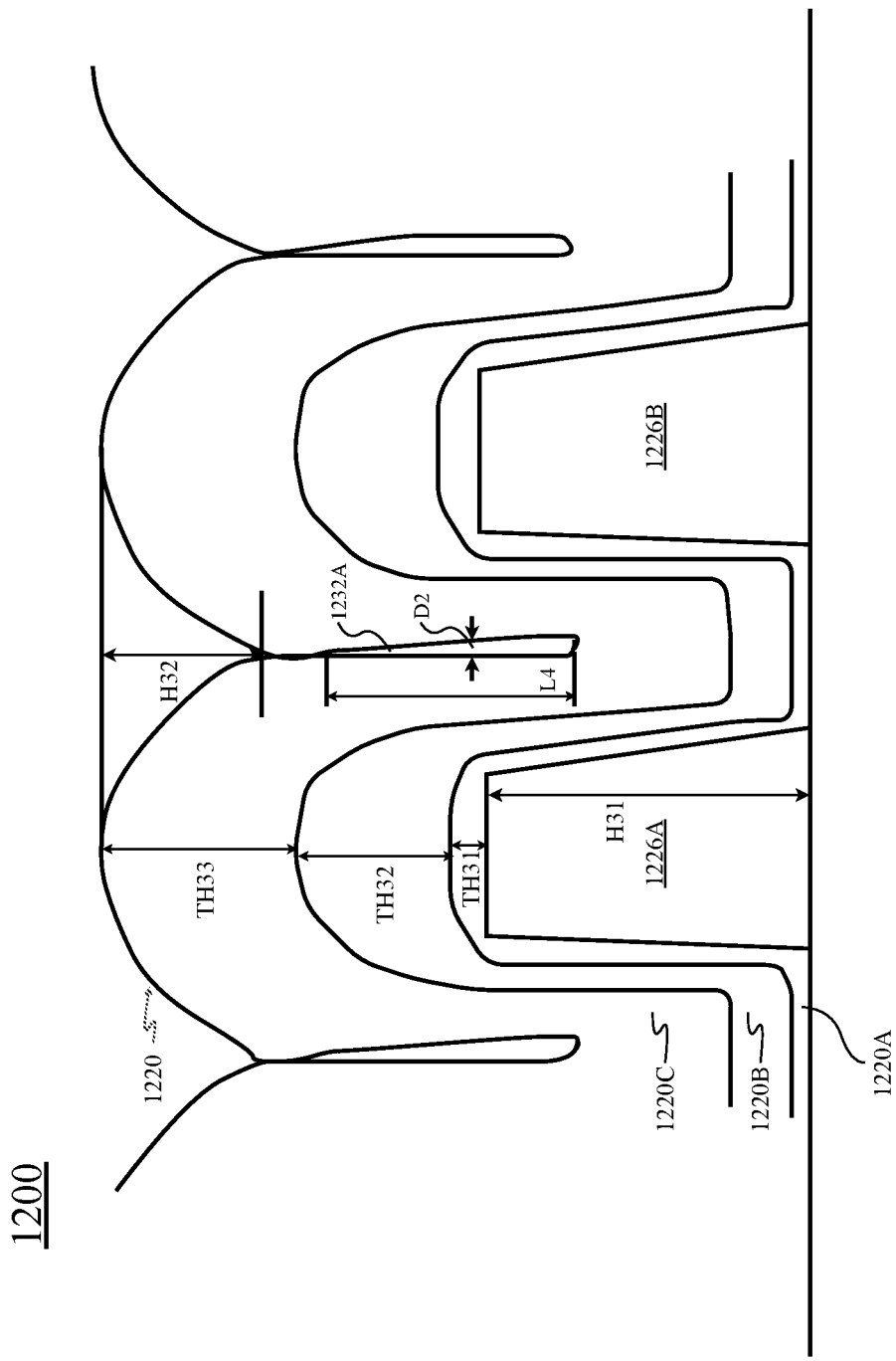
FIG. 12 is a cross-section of a semiconductor device, in accordance with some embodiments of the present disclosure.

FIG. 12 is a cross-section of the semiconductor device 1200, in accordance with some embodiments of the present disclosure. The cross-section of the semiconductor device 1200 shown in FIG. 12 may be observed along a line similar to the line CC' of semiconductor device 200 of FIG. 2A. No vias may appear in the cross-section of FIG. 12.

The semiconductor device 1200 may be similar to the semiconductor device 1100 shown in FIG. 11. The semiconductor device 1200 may include pads 1226A and 1226B, passivation layer 1220, and void 1232A.

The pads 1226A and 1226B shown in the cross-section of FIG. 12 may comprise aluminum, copper, an aluminum copper alloy, the like, or a combination thereof and may be formed to have a substantial height H31 between about 1.4 µm and about 2.8 µm. In one embodiment, the substantial height H31 of the pads 1226A and 1226B may be 2.5 µm (e.g., semiconductor devices manufactured under a 28 nm process).

The passivation layer 1220 may include a layer of dielectric material 1220A, a layer of dielectric material 1220B, and a layer of dielectric material 1220C. The dielectric material 1220A may include undoped silicate glass (USG). The dielectric material 1220B may include high density plasma (HDP) oxide (e.g., a layer of oxide formed by a HDP chemical vapor deposition). The dielectric material 1220C may include silicon nitride (e.g., SiN).

The semiconductor devices of the present disclosure may be manufactured under processes of different nanometer scale. For semiconductor devices manufactured under a 28 nm process, the layer of dielectric material 1220A may be formed to have a thickness TH31 about 0.2 µm. A part of the layer of dielectric material 1220A on the pad 1226A or 1226B may be formed to have a thickness TH31 about 0.2 µm. The layer of dielectric material 1220B may be formed to have a thickness TH32 about 1.3 µm. A part of the layer of dielectric material 1220B on the pad 1226A or 1226B may be formed to have a thickness TH32 about 1.3 µm. The layer of dielectric material 1220C may be formed to have a thickness TH33 of about 1.6 µm. A part of the layer of dielectric material 1220C on the pad 1226A or 1226B may be formed to have a thickness TH33 of about 1.6 µm. The passivation layer 1220 may be formed to have a thickness of about 3.1 µm. A part of the passivation layer 1220 on the pad 1226A or 1226B may be formed to have a thickness of about 3.1 µm.

The passivation layer 1220 may be substantially continuous since no obvious trenches are formed between the pads 1226A and 1226B. The layer of dielectric material 1220C may be substantially continuous since no obvious trenches are formed between the pads 1226A and 1226B. The profile of the top surface of the passivation layer 1220 may be formed to have a top point and a bottom point. The height H32 from the bottom point to the top point may be about 1.30 µm.

The void 1232A may be formed within the passivation layer 1220. The void 1232A may be formed within the layer of dielectric material 1220C. The void 1232A may be formed between the pads 1226A and 1226B. The void 1232A may be separated from the pads 1232A and 1232B by the same distances. The void 1232A may be formed at the central point of the line connected the pads 1226A and 1226B. The void 1232A may be shaped as fusiform. For semiconductor devices manufactured under a 28 nm process, the void 1232A may be formed to have a length L4 about 2.05 µm and a width D2 about 0.14 µm. In some embodiments, the semiconductor devices may be manufactured under processes of different nanometer scale.

Figure 13:
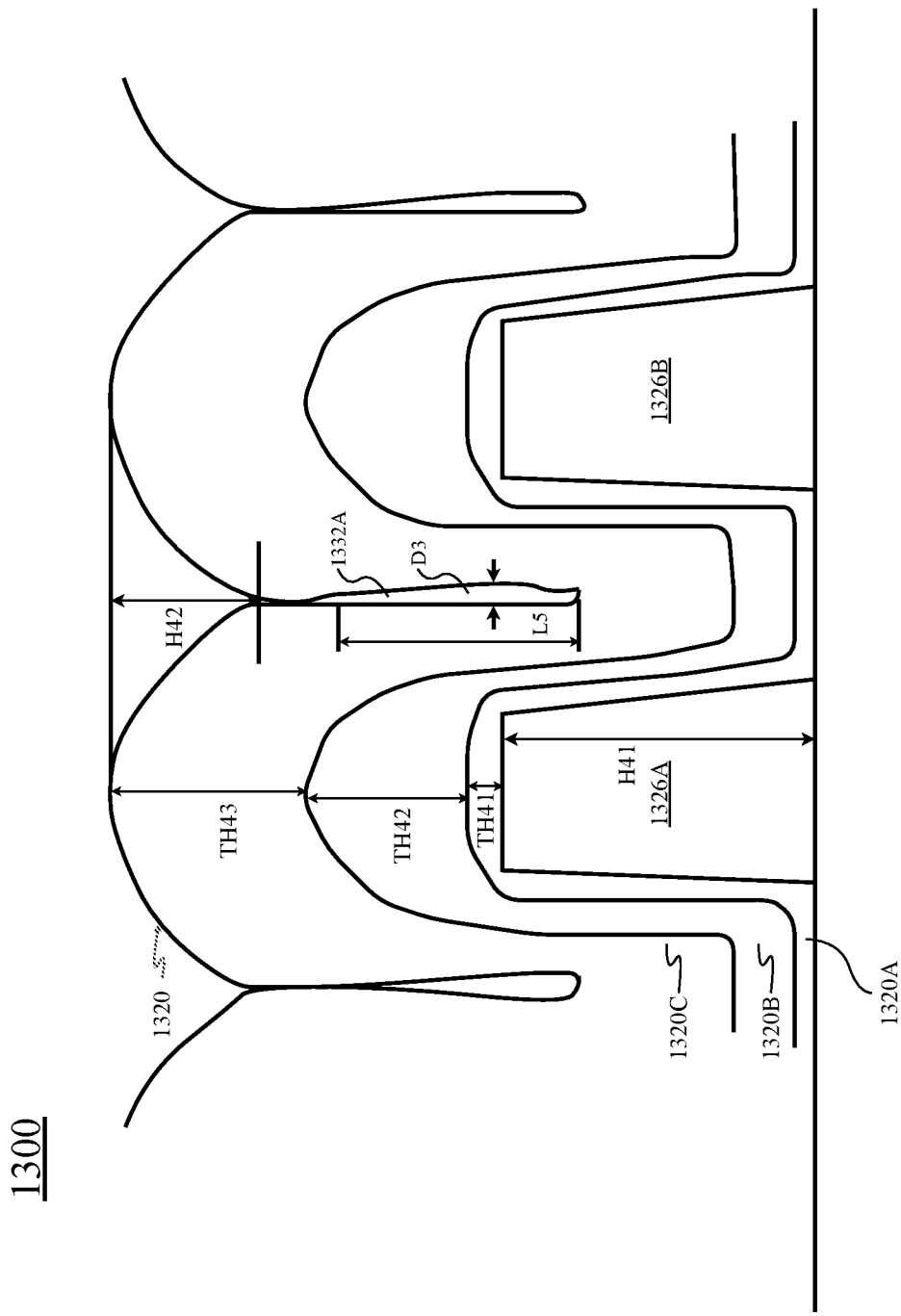
FIG. 13 is a cross-section of a semiconductor device, in accordance with some embodiments of the present disclosure.

FIG. 13 is a cross-section of the semiconductor device 1300, in accordance with some embodiments of the present disclosure. The cross-section of the semiconductor device 1300 shown in FIG. 13 may be observed along a line similar to the line CC' of semiconductor device 200 of FIG. 2A. No vias may appear in the cross-section of FIG. 13.

The semiconductor device 1300 may be similar to the semiconductor device 1100 shown in FIG. 11. The semiconductor device 1300 may include pads 1326A and 1326B, passivation layer 1320, and void 1332A.

The pads 1326A and 1326B shown in the cross-section of FIG. 13 may comprise aluminum, copper, an aluminum copper alloy, the like, or a combination thereof and may be formed to have a substantial height H41 between about 1.4 µm and about 2.8 µm. In one embodiment, the substantial height H41 of the pads 1326A and 1326B may be 2.5 µm (e.g., semiconductor devices manufactured under a 28 nm process).

The passivation layer 1320 may include a layer of dielectric material 1320A, a layer of dielectric material 1320B, and a layer of dielectric material 1320C. The dielectric material 1320A may include undoped silicate glass (USG). The dielectric material 1320B may include high density plasma (HDP) oxide (e.g., a layer of oxide formed by a HDP chemical vapor deposition). The dielectric material 1320C may include silicon nitride (e.g., SiN).

In some embodiments, the semiconductor devices of the present disclosure may be manufactured under processes of different nanometer scale. For semiconductor devices manufactured under a 28 nm process, the layer of dielectric material 1320A may be formed to have a thickness TH41 about 0.2 µm. A part of the layer of dielectric material 1320A on the pad 1326A or 1326B may be formed to have a thickness TH41 about 0.2 µm. The layer of dielectric material 1320B may be formed to have a thickness TH42 about 1.3 µm. A part of the layer of dielectric material 1320B on the pad 1326A or 1326B may be formed to have a thickness TH42 about 1.3 µm. The layer of dielectric material 1320C may be formed to have a thickness TH43 of about 1.8 µm. A part of the layer of dielectric material 1320C on the pad 1326A or 1326B may be formed to have a thickness TH43 of about 1.8 µm. The passivation layer 1320 may be formed to have a thickness of about 3.3 µm. A part of the passivation layer 1320 on the pad 1326A or 1326B may be formed to have a thickness of about 3.3 µm.

The passivation layer 1320 may be substantially continuous since no obvious trenches are formed between the pads 1326A and 1326B. The layer of dielectric material 1320C may be substantially continuous since no obvious trenches are formed between the pads 1326A and 1326B. The profile of the top surface of the passivation layer 1320 may be formed to have a top point and a bottom point. The height H42 from the bottom point to the top point may be about 1.10 µm.

The void 1332A may be formed within the passivation layer 1320. The void 1332A may be formed within the layer of dielectric material 1320C. The void 1332A may be formed between the pads 1326A and 1326B. The void 1332A may be separated from the pads 1332A and 1332B by the same distances. The void 1332A may be formed at the central point of the line connected the pads 1326A and 1326B. The void 1332A may be shaped as fusiform. The semiconductor devices of the present disclosure may be manufactured under processes of different nanometer scale. For semiconductor devices manufactured under a 28 nm process, the void 1332A may be formed to have a length L5 about 2.04 µm and a width D3 about 0.13 µm.

Figure 14:
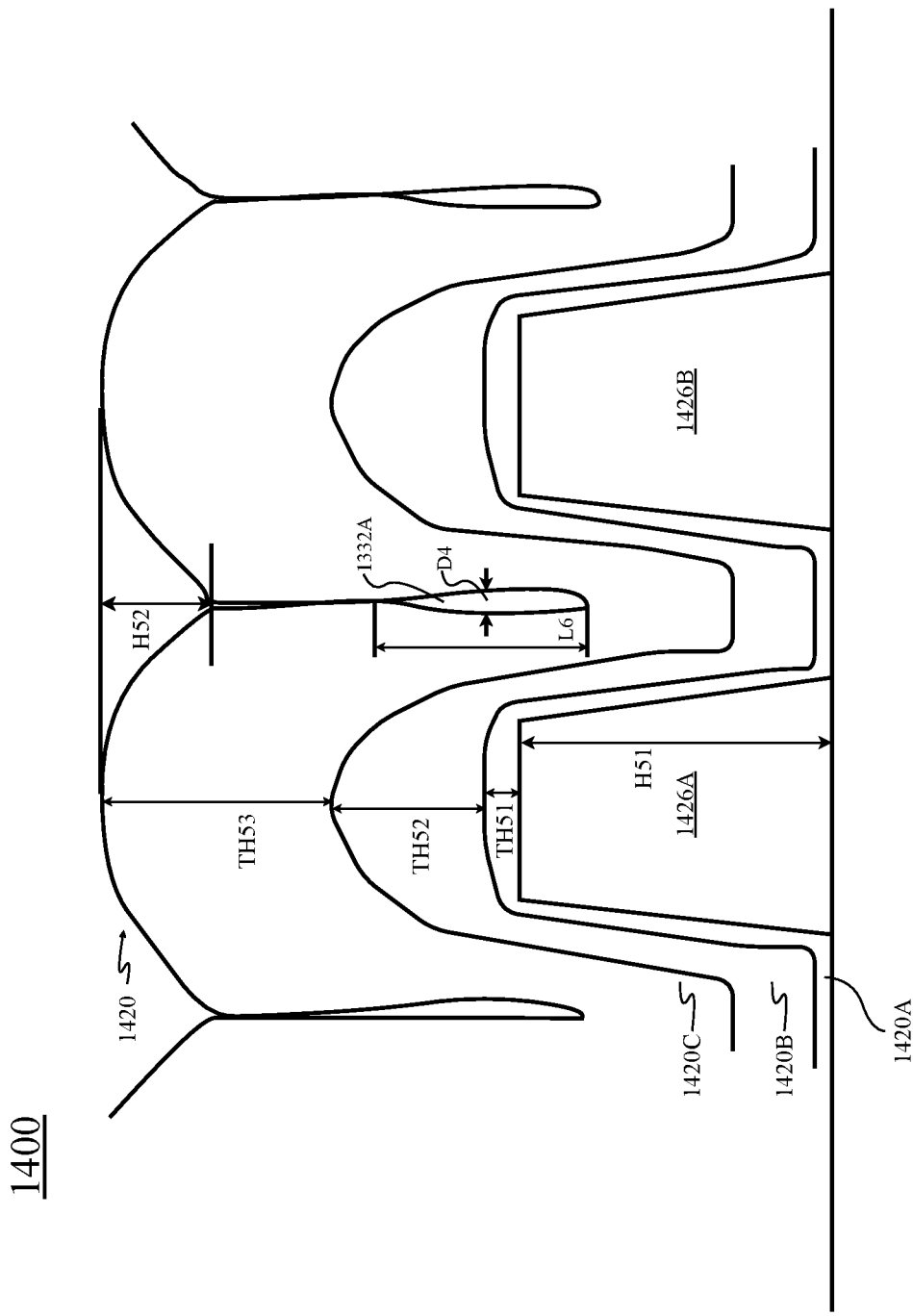
FIG. 14 is a cross-section of a semiconductor device, in accordance with some embodiments of the present disclosure.

FIG. 14 is a cross-section of the semiconductor device 1400, in accordance with some embodiments of the present disclosure. The cross-section of the semiconductor device 1400 shown in FIG. 14 may be observed along a line similar to the line CC' of semiconductor device 200 of FIG. 2A. No vias may appear in the cross-section of FIG. 14.

The semiconductor device 1400 may be similar to the semiconductor device 1100 shown in FIG. 11. The semiconductor device 1400 may include pads 1426A and 1426B, passivation layer 1420, and void 1432A.

The pads 1426A and 1426B shown in the cross-section of FIG. 14 may comprise aluminum, copper, an aluminum copper alloy, the like, or a combination thereof and may be formed to have a substantial height H51 between about 1.4 µm and about 2.8 µm. In one embodiment, the substantial height H51 of the pads 1426A and 1426B may be 2.5 µm (e.g., semiconductor devices manufactured under a 28 nm process).

The passivation layer 1420 may include a layer of dielectric material 1420A, a layer of dielectric material 1420B, and a layer of dielectric material 1420C. The dielectric material 1420A may include undoped silicate glass (USG). The dielectric material 1420B may include high density plasma (HDP) oxide (e.g., a layer of oxide formed by a HDP chemical vapor deposition). The dielectric material 1420C may include silicon nitride (e.g., SiN).

The semiconductor devices of the present disclosure may be manufactured under processes of different nanometer scale. For semiconductor devices manufactured under a 28 nm process, the layer of dielectric material 1420A may be formed to have a thickness TH51 about 0.2 µm. A part of the layer of dielectric material 1420A on the pad 1426A or 1426B may be formed to have a thickness TH51 about 0.2 µm. The layer of dielectric material 1420B may be formed to have a thickness TH52 about 1.3 µm. A part of the layer of dielectric material 1420B on the pad 1426A or 1426B may be formed to have a thickness TH52 about 1.3 µm. The layer of dielectric material 1420C may be formed to have a thickness TH53 of about 2 µm. A part of the layer of dielectric material 1420C on the pad 1426A or 1426B may be formed to have a thickness TH53 of about 2 µm. The passivation layer 1420 may be formed to have a thickness of about 3.5 µm. A part of the passivation layer 1420 on the pad 1426A or 1426B may be formed to have a thickness of about 3.5 µm.

The passivation layer 1420 may be substantially continuous since no obvious trenches are formed between the pads 1426A and 1426B. The layer of dielectric material 1420C may be substantially continuous since no obvious trenches are formed between the pads 1426A and 1426B. The profile of the top surface of the passivation layer 1420 may be formed to have a top point and a bottom point. The height H52 from the bottom point to the top point may be about 0.96 µm.

The void 1432A may be formed within the passivation layer 1420. The void 1432A may be formed within the layer of dielectric material 1420C. The void 1432A may be formed between the pads 1426A and 1426B. The void 1432A may be separated from the pads 1432A and 1432B by the same distances. The void 1432A may be formed at the central point of the line connected the pads 1426A and 1426B. The void 1432A may be shaped as fusiform. The semiconductor devices of the present disclosure may be manufactured under processes of different nanometer scale. For semiconductor devices manufactured under a 28 nm process, the void 1432A may be formed to have a length L6 about 1.9 µm and a width D4 about 0.13 µm.

From FIGS. 11 to 14, it may be observed that the height H22 exceeds the height H32, the height H32 exceeds the height H42, and the height H42 exceeds H52. When the passivation layer (e.g., the passivation layer 1120, 1220, 1320, or 1420) is thicker, the height from the bottom point to the top point of the top surface of the passivation layer may be smaller.

Some embodiments of the present disclosure provide a semiconductor device. The semiconductor device may include a substrate, a first pad, a second pad, a first passivation layer, and a void. The first pad may be over the substrate. The second pad may be over the substrate. The second pad may be parallel to the first pad. The first passivation layer may surround the first pad and the second pad. The void may be within the first passivation layer.

Some embodiments of the present disclosure provide a semiconductor device. The semiconductor device may include a substrate, a first via, a first pad, a second pad, and a first passivation layer. The first pad may be over the substrate. The second pad may be over the substrate. The second pad may be parallel to the first pad. The first passivation layer may surround the first pad and the second pad. The first passivation layer may include a first part on the first pad. The first passivation layer may include a second part on the second pad. A thickness of the first part of the first passivation layer may exceed a height of the first pad. A thickness of the second part of the first passivation layer may exceed a height of the second pad.

Some embodiments of the present disclosure provide a method of manufacturing a semiconductor device. The method may include: forming an integrated circuit on a substrate; forming a first metal contact and a second metal contact over the substrate; forming a first passivation layer over the first metal contact and the second metal contact; forming a first opening and a second opening on the first passivation layer; forming a first via within the first opening and a second via within the second opening; forming a first pad and a second pad parallel to the first pad, the first pad connecting to the first metal contact through the first via, the second pad connecting to the second metal contact through the second via; and forming a second passivation layer surrounding the first pad and the second pad. The second passivation layer may include a void between the first pad and the second pad.

A semiconductor device may include a substrate, a first pad over the substrate, a second pad over the substrate, the second pad parallel to the first pad, a first passivation layer surrounding the first pad and the second pad, and a void within the first passivation layer. The first passivation layer may include a first dielectric material, a second dielectric material, and a third dielectric material. The first dielectric material may be on the first pad, the second dielectric material may be on the first dielectric material, the third dielectric material may be on the second dielectric material, and a first ratio of a thickness of the third dielectric material to a thickness of the first dielectric material may exceed 7.

The third dielectric material may include silicon nitride. The first dielectric material may include undoped silicate glass. The second dielectric material may include high density plasma (HDP) oxide. The thickness of the third dielectric material may exceed 1.4 µm.

The void may be between the first pad and the second pad, and the void may be separated from the first pad and the second pad by the same distance.

The semiconductor device may further comprise a first via under the first pad and connecting the first pad. A second ratio of a width of the first via to the width of the first pad may be between 0.16 to 0.48. A third ratio of the width of the first via to a length of the first via may not exceed 0.34.

A semiconductor device may include a substrate, a first pad over the substrate, a second pad over the substrate, where the second pad is parallel to the first pad, and a first passivation layer surrounding the first pad and the second pad. The first passivation layer may include a first part on the first pad and a second part on the second pad. A thickness of the first part of the first passivation layer may exceed a height of the first pad, and a thickness of the second part of the first passivation layer may exceed a height of the second pad.

The first passivation layer may include a first dielectric material, a second dielectric material, and a third dielectric material. The first dielectric material may be on the first pad, the second dielectric material may be on the first dielectric material, and the third dielectric material may be on the second dielectric material. A first ratio of a thickness of the third dielectric material to a thickness of the first dielectric material may exceed 7. The third dielectric material may include silicon nitride. The thickness of the third dielectric material may exceed 1.4 µm.

The semiconductor device may further comprise a void within the first passivation layer and between the first pad and the second pad.

The semiconductor device may further comprise a first via under the first pad and connecting the first pad. A second ratio of a width of the first via to the width of the first pad may be between 0.16 to 0.48. A third ratio of the width of the first via to a length of the first via may not exceed 0.34.

A method of manufacturing a semiconductor device may include forming an integrated circuit on a substrate, forming a first metal contact and a second metal contact over the substrate, forming a first passivation layer over the first metal contact and the second metal contact, forming a first opening and a second opening on the first passivation layer, forming a first via within the first opening and a second via within the second opening, forming a first pad and a second pad parallel to the first pad, and forming a second passivation layer surrounding the first pad and the second pad. The first pad may be connected to the first metal contact through the first via, the second pad may be connected to the second metal contact through the second via, and the second passivation layer may include a void between the first pad and the second pad.

The first passivation layer may include a first dielectric material, a second dielectric material, and a third dielectric material. The first dielectric material may be on the first pad. The second dielectric material may be on the first dielectric material. The third dielectric material may be on the second dielectric material. A ratio of a thickness of the third dielectric material to a thickness of the first dielectric material may exceed 7. The third dielectric material may include silicon nitride. The thickness of the third dielectric material may exceed 1.4 µm. A first ratio of the width of the first and second vias to the length of the first and second vias may not exceed 0.34.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a multi-layer passivation layer disposed over a substrate;
a first metal pad and a second metal pad disposed in the multi-layer passivation layer, wherein the first metal pad and the second metal pad extend lengthwise along a first direction, a space is between the first metal pad and the second metal pad along a second direction, the second direction is different than the first direction, and the multi-layer passivation layer is in the space between the first metal pad and the second metal pad, and further wherein the multi-layer passivation layer includes:
a first passivation layer, and
a second passivation layer, wherein the first passivation layer is disposed over the second passivation layer; and
a void disposed within the multi-layer passivation layer in the space between the first metal pad and the second metal pad, wherein the void is within the first passivation layer of the multi-layer passivation layer.

2. The device of claim 1, wherein:
the first passivation layer includes silicon and nitrogen and the second passivation layer includes silicon and oxygen; and
the first passivation layer has a first thickness, the second passivation layer has a second thickness, and the first thickness is greater than the second thickness.

3. The device of claim 2, wherein the multi-layer passivation layer further includes a third passivation layer disposed under the second passivation layer, wherein the third passivation layer includes silicon and oxygen, the third passivation layer is different than the second passivation layer, and the third passivation layer has a third thickness that is less than the first thickness of the first passivation layer.

4. The device of claim 3, wherein a ratio of the first thickness of the first passivation layer to the third thickness of the third passivation layer is greater than 7.

5. The device of claim 2, wherein the first thickness of the first passivation layer is about 1.4 µm to about 2.0 µm.

6. The device of claim 2, wherein the second passivation layer is free of the void.

7. The device of claim 2, wherein the first passivation layer is a topmost passivation layer of the multi-layer passivation layer.

8. The device of claim 2, wherein the second passivation layer is between the first passivation layer and a first sidewall of the first metal pad and between the first passivation layer and a second sidewall of the second metal pad.

9. The device of claim 1, wherein a first distance between the first metal pad and the void is about equal to a second distance between the second metal pad and the void, wherein the first distance and the second distance are along the second direction.

10. A device comprising:
a multi-layer passivation layer disposed over a substrate;
a first aluminum pad and a second aluminum pad disposed in the multi-layer passivation layer, wherein the first aluminum pad and the second aluminum pad extend substantially parallel to one another along a first direction, a space is between the first aluminum pad and the second aluminum pad along a second direction, the second direction is different than the first direction, and the multi-layer passivation layer fills the space between the first aluminum pad and the second aluminum pad, and further wherein a top of a first portion of the multi-layer passivation layer in the space between the first aluminum pad and the second aluminum pad is lower than tops of second portions of the multi-layer passivation layer that are disposed over tops of the first aluminum pad and the second aluminum pad; and
a void disposed within the multi-layer passivation layer in the space between the first aluminum pad and the second aluminum pad.

11. The device of claim 10, wherein the multi-layer passivation layer includes:
a first silicon oxide layer having a first thickness;
a second silicon oxide layer disposed over the first silicon oxide layer, wherein the second silicon oxide layer has a second thickness; and
a silicon nitride layer disposed over the second silicon oxide layer, wherein the silicon nitride layer has a third thickness, the third thickness is greater than the first thickness, the third thickness is greater than the second thickness, and the void is disposed in the silicon nitride layer.

12. The device of claim 10, wherein the void is disposed between a first sidewall of the first aluminum pad and a second sidewall of the second aluminum pad.

13. The device of claim 10, wherein a distance between the top of the multi-layer passivation layer and the tops of the second portions of the multi-layer passivation layer is less than about 1.5 µm.

14. A device comprising:
a first metal via and a second metal via;
a first metal line and a second metal line that extend substantially parallel along a first direction, wherein the first metal line is disposed on the first metal via, the second metal line is disposed on the second metal via, and the first metal line is separated by the second metal line by a distance along a second direction that is different than the first direction; and
a multi-layer dielectric layer between the first metal line and the second metal line, wherein the multi-layer dielectric layer spans the distance from the first metal line to the second metal line, and a void is disposed within the multi-layer dielectric layer in the distance between the first metal line and the second metal line, wherein the multi-layer dielectric layer has a u-shaped structure between the first metal line and the second metal line.

15. The device of claim 14, wherein:
the multi-layer dielectric layer includes a silicon nitride layer;
the void is disposed in the silicon nitride layer; and
a total thickness of the multi-layer dielectric layer is about 2.9 µm to about 3.5 µm, a thickness of the silicon nitride layer is about 1.4 µm to about 2.0 µm, and the thickness of the silicon nitride layer is a greatest thickness of thicknesses of the multi-layer dielectric layer.

16. The device of claim 14, wherein:
the first metal via and the second metal via have a first width;
the first metal line and the second metal line have a second width;
the first width and the second width are along the second direction; and
a ratio of the first width to the second width is about 0.16 to about 0.48.

17. The device of claim 16, wherein:
the first metal via and the second metal via have a length along the first direction; and
a ratio of the first width to the length is less than about 0.34.

18. The device of claim 14, wherein the multi-layer dielectric layer includes a silicon oxide layer and a silicon nitride layer, wherein the silicon oxide layer separates the silicon nitride layer from the first metal line and the second metal line.

19. The device of claim 18, wherein the silicon oxide layer includes an undoped silicate glass layer and a high-density plasma silicon oxide layer.

20. The device of claim 14, wherein the multi-layer dielectric layer includes a first dielectric layer wrapped by a second dielectric layer, wherein the void is disposed in the first dielectric layer.

* * * * *